(12) United States Patent
Hartwich et al.

(10) Patent No.: US 7,189,988 B2
(45) Date of Patent: Mar. 13, 2007

(54) MOLECULAR ELECTRONICS ARRANGEMENT AND METHOD FOR PRODUCING A MOLECULAR ELECTRONICS ARRANGEMENT

(75) Inventors: Jessica Hartwich, Neubiberg (DE); Johannes Kretz, München (DE); Richard Johannes Luyken, München (DE); Wolfgang Rösner, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 192 days.

(21) Appl. No.: 10/482,719

(22) PCT Filed: Jul. 1, 2002

(86) PCT No.: PCT/DE02/02379

§ 371 (c)(1),
(2), (4) Date: Jun. 14, 2004

(87) PCT Pub. No.: WO03/005369

PCT Pub. Date: Jan. 16, 2003

(65) Prior Publication Data

US 2004/0219731 A1 Nov. 4, 2004

(30) Foreign Application Priority Data

Jul. 5, 2001 (DE) ................ 101 32 640

(51) Int. Cl.
*H01L 35/24* (2006.01)
(52) U.S. Cl. ............... 257/40; 438/99; 438/E51.045; 438/618
(58) Field of Classification Search ........... 438/82, 438/99, 598, 610, 618, 605, 622–624; 257/40, 257/642
See application file for complete search history.

(56) References Cited

U.S. PATENT DOCUMENTS 5,270,965 A 12/1993 Yanagisawa et al.

(Continued)

FOREIGN PATENT DOCUMENTS

| DE | 10013013 | 10/2000 |
|---|---|---|
| WO | 01/27972 | 4/2001 |

OTHER PUBLICATIONS

Kimizuka, Nobuo, et al., "Organic Two-Dimensional Templates for the Fabrication of Inorganic Nanostructures: Organic/Inorganic Superlattices," Advanced Materials, pp. 89-91, Jan. 1996.

(Continued)

*Primary Examiner*—Andy Huynh
*Assistant Examiner*—Quoc Hoang
(74) *Attorney, Agent, or Firm*—Dicke, Billig & Czaja, P.L.L.C.

(57) ABSTRACT

The invention relates to a molecular electronics arrangement comprising a substrate, at least one first strip conductor having a surface and being arranged in or on the substrate, a spacer which is arranged on the surface of the at least one first strip conductor and which partially covers the surface of the at least one first strip conductor, and at least one second strip conductor which is arranged on the spacer and comprises a surface which faces the surface of the at least one first strip conductor in a plane manner. The spacer partially covers the surface of the at least one second strip conductor, and defines a pre-determined distance between the at least one first strip conductor and the at least one second strip conductor. The inventive molecular electronics arrangement also comprises molecular electronics molecules which are arranged between a free region of the surface of the at least one first strip conductor and a free region of the surface of the at least one second strip conductor, the length of said molecules being essentially equal to the distance between the at least one first strip conductor and the at least one second strip conductor. The invention also relates to a method for producing a molecular electronics arrangement.

30 Claims, 8 Drawing Sheets

U.S. PATENT DOCUMENTS

| | | | |
|---|---|---|---|
| 5,475,341 A | | 12/1995 | Reed |
| 5,729,379 A | * | 3/1998 | Allemand et al. .......... 359/270 |
| 6,128,214 A | | 10/2000 | Kuekes et al. |
| 6,232,637 B1 | * | 5/2001 | Gardner et al. ............. 257/368 |
| 6,794,533 B1 | * | 9/2004 | Hanyu ......................... 560/73 |
| 6,998,637 B2 | * | 2/2006 | Luyken et al. ................ 257/40 |

OTHER PUBLICATIONS

Metzger et al., "Unimolecular Electrical Rectification in Hexadecylquinolinium Tricyanoquinodimethanide," Journal Am. Chem. Soc., 119, pp. 10455-10466, 1997.

Ellenbogen, J.C., et al., "Architectures for Molecular Electronic Computers: I. Logic Structures and Adder Designed from Molecular Electronic Diodes," Proceedings of the IEEE, vol. 8, No. 3, Mar. 2000.

Gittens, D.I., et al., "Redox-Connected Multilayers of Discrete Gold Particles: A Novel Electroactive Nanomaterial," Advanced Materials, 11, No. 9, Mar. 2000.

Collier, C.P., et al., "Electronically Configurable Molecular-Based Logic Gates," Science, vol. 285, pp. 391-394, Jul. 16, 1999.

Chen, J., et al., "Large On-off Ratios and Negative Differential Resistance in a Molecular Electronic Device," Science, vol. 286, pp. 1550-1552, Nov. 19, 1999.

Emberly, E., et al., Principles for the Design and Operation of a Molecular Wire Transistor, Journal of Applied Physics, vol. 88, No. 9, Nov. 2000.

Gittins, D.I., et al., "A Nanometer-scale Electronic Switch Consisting of a Metal-cluster and Redox-addressable Groups," Nature, 408:67-69, Nov. 2000.

English Abstract of DE10013013.

* cited by examiner

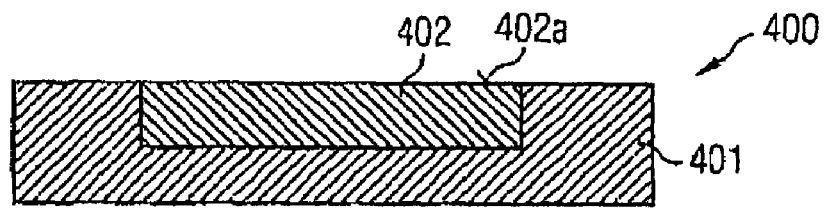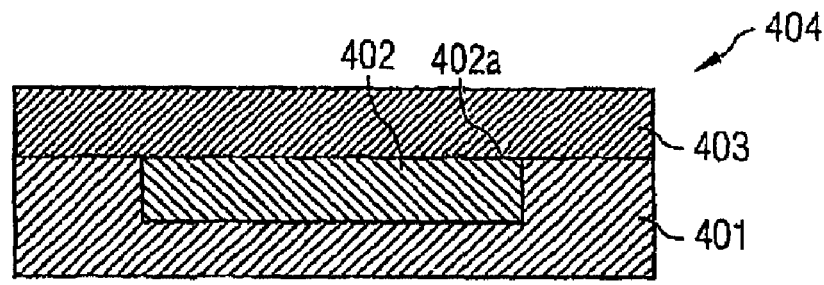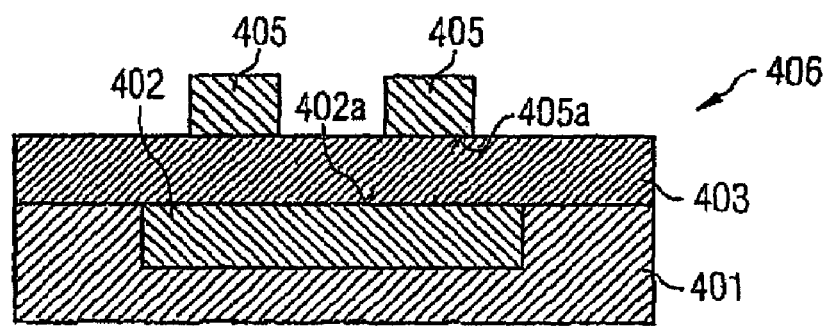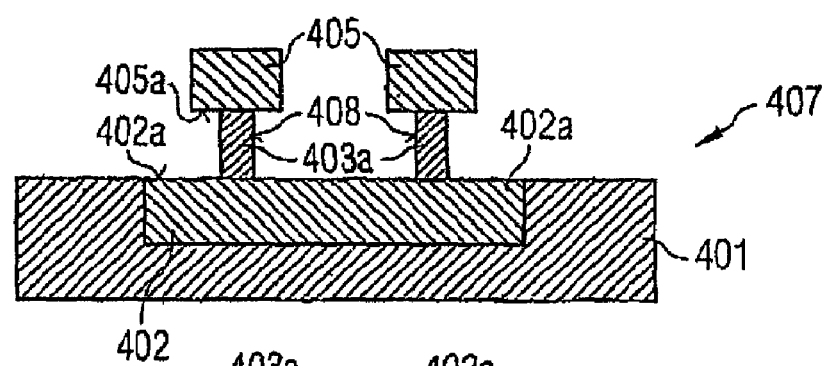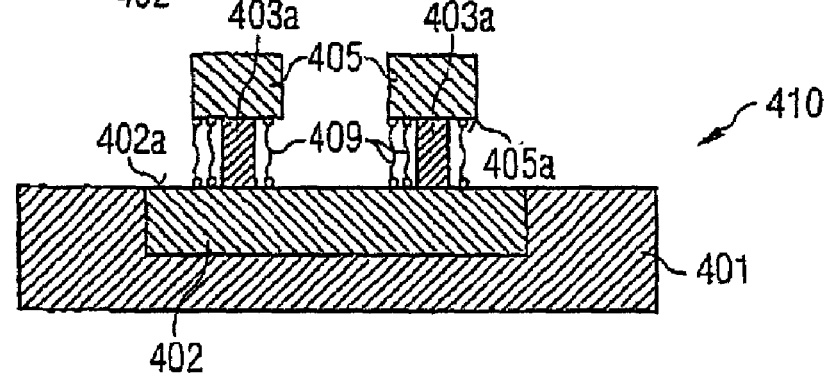

MOLECULAR ELECTRONICS ARRANGEMENT AND METHOD FOR PRODUCING A MOLECULAR ELECTRONICS ARRANGEMENT

CROSS-REFERENCE TO RELATED APPLICATIONS

This application is a U.S. National-Stage entry under 35 U.S.C. § 371 based on International Application No. PCT/DE02/02379, filed 1 Jul. 2002, which was published under PCT Article 21 (2); this application also claims priority under 35 U.S.C. § 119 to German Application No. DE 101 32 640.8, filed Jul. 5, 2001.

BACKGROUND OF THE INVENTION

The invention relates to a molecular electronics arrangement and a method for fabricating a molecular electronics arrangement.

Conventional silicon microelectronics will reach its limits as miniaturization advances further. In particular the development of increasingly smaller and more densely arranged transistors of hundreds of millions of transistors per chip will be subject to fundamental physical problems in the next ten years. If structural dimensions fall below 80 nanometers, the components are influenced by quantum effects in a disturbing manner, and they are dominated by quantum effects at dimensions of below about 30 nanometers. The increasing integration density of the components on a chip also leads to a dramatic increase in the waste heat.

One known possible successor technology to follow conventional semiconductor electronics is molecular electronics, in which both electron conduction and fundamental component functions are performed by suitable molecules. An overview of the field of molecular electronics is given by [1], for example. There are predominantly two types of molecules suitable for realizing electronic component functions. They are firstly molecules based on carbon nanotubes and secondly molecules based on polyphenylene.

Ellenbogen, J C, Love, J C (1999) "Architectures for molecular electronic computers; 1. Logic structures and an adder built from molecular electronic diodes", MITRE Nanosystems Group, McLean, Va. discloses examples of molecular electronic molecules which, on account of their atomic structure, have the capability of fulfilling the function of an electrical conductor, an electrical insulator or a diode. Furthermore, the same document discloses molecules which perform the function of logic gates.

Accordingly, many component functions that are usually realized by conventional silicon microelectronics can also be realized by molecular electronic molecules, molecular electronics having the advantage of a considerably smaller dimension compared with conventional electronics. Whereas the smallest semiconductor structures that can be realized nowadays are of the order of magnitude of a few nanometers, structural dimensions down to the angstrom range are conceivable in the case of molecular electronic molecules. This means that significantly more compact arrangements of circuits are possible and the waste heat that occurs is a small amount in the case of molecular electronic circuits. Furthermore, Gittins, D I, Bethell, D, Schiffrin, D J, Nichols, R J (2000) "A nanometer-scale electronic switch consisting of a metal-cluster and redox-addressable groups" Nature 408:67–69 discloses that bispyridinium molecules have the property of occurring in two redox states the molecule having a greatly different electrical conductivity in the two redox states. Bispyridinium molecules have a low electrical conductivity in the oxidized state; the electrical conductivity is significantly higher in the reduced state. If a sufficiently high electrical voltage is applied to the molecule, then it is thereby possible to bring about the transition of the molecule from one state to the other. The redox transitions are reversible. On the basis of these properties, Gittins et al. describes the use of bispyridinium molecules as molecular electronic nanoswitches.

On account of their electrical properties and their small dimension, recently there has been much discussion concerning the use of organic, in particular biological, molecules for electronic applications. In this case, the problem arises that it is necessary to bind the molecular electronic molecules to suitable contacts, for example metallic conductors. This is necessary for the coupling to conventional silicon microelectronics.

Molecular electronic molecules are provided with functional groups which are suitable for chemical binding to a conductor material. The binding of thiol groups (SH), which occur at the end sections of many biomolecules, to conductor surfaces made of gold material has proved to be particularly suitable. The metallic conductors have to be provided in a suitable arrangement at a distance from one another which lies in the nanometers range, in order that the interspaces between two such conductor surfaces can be bridged by the molecular electronic molecules. The linear extents of molecular electronic molecules are typically of the order of magnitude of between a few angstroms and up to hundreds of nanometers.

The prior art discloses techniques for enabling a molecular electronic molecular to be coupled to conductor surfaces at two of its end sections. Thus, often a gold interconnect is fabricated by means of electron beam lithography, for example, said interconnect having a constriction of approximately 10 nanometers wide at its narrowest point. Such an interconnect is then torn away in a controlled manner at the narrowest point in a bending device, the distance between the two torn-away ends lying in the nanometers range and being adjustable by means of the bending mechanism. If a solution comprising molecular electronic molecules whose extent essentially corresponds to the distance between the two torn-away ends is then added, these molecules may bind for example via two thiol groups to the two torn-away ends, for example made of gold material, and electrically bridge the latter.

Even though this procedure is suitable for laboratory experiments, it is unsuitable for the integration of many molecular bridges. Applications of molecular electronics that are of economic interest aim, however, precisely to form a multiplicity of molecular electronic couplings between metallic electrodes. Therefore, the method described is too time-consuming and too expensive to be considered for the mass production of arrangements with a large multiplicity of molecular electronic components. Furthermore, the degree of reproducibility is low in the case of the described method for coupling metallic conductors by means of a molecular electronic molecule. It is difficult to carry out the tearing-away of the constricted gold interconnect by the bending device under controlled conditions. Furthermore, slightly different torn-away ends are obtained in each tearing-away operation, so that it is not possible to exactly set the distance between the torn-away ends. However, in order that molecular electronic molecules can immobilize on two conductor surfaces, a very precise matching of the linear extent of the molecule, on the one hand, and the distance between the conductor planes, on the other hand, is necessary.

As an alternative, there are proposals firstly to fabricate a contact electrode, then to apply the organic material (for example in the form of a monomolecular layer) and then to deposit the second electrode thereon. In this case, the process for fabricating the second electrode is to be chosen in such a way that the organic material is not damaged, which is a considerable restriction. Semiconductor technological method steps are often performed at high temperatures. Biomolecules are often unstable compounds which react extremely sensitively to excessively high temperatures. By way of example, it is known that many proteins denature irreversibly, and can thus be destroyed, at temperatures as low as slightly above room temperature. What is more, many semiconductor technological methods require the presence of aggressive chemicals (e.g. etching chemicals or deposition gases). Sensitive molecules can thereby easily be destroyed. By way of example, proteins and DNA strands can be decomposed if the pH value deviates too far from physiological pH values. For arrangements of economic interest, however, no consideration can be shown for the sensitivity of the molecules during the formation of the second electrode if the arrangements fabricated in accordance with the method are intended to be economically competitive. On the other hand, consideration must be shown for the intactness of the biomolecules, since biomolecules are frequently present only in low concentrations and are often expensive. Therefore, the method described is suitable only to a very limited extent for introducing sensitive, in particular temperature-sensitive, biomolecules.

To summarize, it can be stated that the known techniques for forming a coupling of two metal electrodes by means of a molecular electronic module have a series of disadvantages. Thus, structurally adequately defined arrangements cannot be fabricated in accordance with the known techniques and the methods are complicated, expensive and not suitable for economic mass production.

DE 100 13 013 A1 and U.S. Pat. No. 6,128,214 in each case describe a chemically synthesized electronic component comprising two crossing conductors between which an electrically addressable molecular species is arranged.

Furthermore, WO 01/27972 A2 describes a molecular electronic device which has two conductive contacts and also a conductive bridge connection between the two contacts. The conductive bridge connection can be brought, by means of a voltage pulse, to an arbitrary one of two predetermined states, to a first state of higher electrical conductivity or to a second state, in which the conductive bridge connection has a lower electrical conductivity by comparison with the first state. The conductive bridge connection has organic molecules.

U.S. Pat. No. 5,270,965 describes a method for driving a component having a pair of electrodes and, embedded between the latter, an organic insulation layer.

Other molecular electronic components are described in E. Emberly et. al, Principles for the design and operation of a molecular wire transistor, Journal of Applied Physics, 88 (2000) 9, pp. 5280–5282, 2000, J. Chen et. al., Large On-Off Ratios and Negative Differential Resistance in a Molecular Electronic Device, Science, 286, pp. 1550–1552, 1999, C. P. Collier et. al., Electronically Configurable Molecular-Based Logic Gates, Science, 285, pp. 391–394, 1999 and R. M. Metzger et. al., Unimolecular Electrical Rectification in Hexadecylquinolinium Tricyanoquinodimethanide, Journal Am. Chem. Soc., 119, pp. 10455–10466, 1997.

SUMMARY OF THE INVENTION

The invention is based on the problem of providing a molecular electronics arrangement in which molecular electronic molecules can be precisely coupled to electrodes with a reduced outlay, and in which the molecular electronic molecules are better protected against destruction.

The problem is solved by means of a molecular electronics arrangement and a method for fabricating a molecular electronics arrangement having the features in accordance with the independent patent claims.

The molecular electronics arrangement of the invention has a substrate, at least one first interconnect, which has a surface and which is arranged in or on the substrate, a spacer arranged on the surface of the at least one first interconnect, which spacer partly covers the surface of the at least one first interconnect, at least one second interconnect arranged on the spacer, which second interconnect has a surface areally opposite the surface of the at least one first interconnect, the spacer partly covering the surface of the at least one second interconnect, and a predetermined distance between the at least one first interconnect and the at least one second interconnect being defined by means of the spacer. The molecular electronics arrangement furthermore has molecular electronic molecules arranged between an uncovered region of the surface of the at least one first interconnect and an uncovered region of the surface of the at least one second interconnect, the length of which molecules is essentially equal to the distance between the at least one first interconnect and the at least one second interconnect.

The invention provides a molecular electronics arrangement in which the distance between the at least one first interconnect and the at least one second interconnect is accurately adjustable by means of the spacer or spacers. An accuracy of the order of magnitude of one atomic layer, i.e. of a few angstroms, can be achieved by applying a defined number of atomic layers of a material to the at least one first interconnect by means of a suitable semiconductor technological method, for example the atomic layer deposition method (ALD method), thereby defining the thickness of the spacer. Since the distance between the first interconnects and the second interconnects should essentially be equal to the length of the molecules to be introduced between them, the distance between the two interconnects can be adapted, according to the invention, to a specific molecule to be incorporated. It should be noted that the length of the respective molecular electronic molecule is dependent on the geometrical arrangement thereof in the interspace between the two interconnects. To put it another way, this means that the distance between the two interconnects may vary by up to a factor of 2 with regard to the length of the respective molecular electronic molecule. In this case, the distance between the two interconnects is always less than the length of the respective molecular electronic molecule.

The molecular electronic molecules may be introduced into the molecular electronics arrangement if the at least one interconnect, the at least one second interconnect and the spacer arranged between them have already been formed. This enables a careful incorporation of the often sensitive molecular electronic molecules, for example biomolecules such as DNA strands or proteins. The molecular electronic molecules are thereby protected against negative influences (as described above with reference to the prior art).

In the molecular electronics arrangement, furthermore, at least one of the first interconnects and/or at least one of the second interconnects may be coupled to an electrically conductive coupling element, by means of which the interconnects can be coupled to an external circuit. Preferably, each of the at least one electrically conductive coupling elements is a contact hole filled with an electrically conductive material, which contact hole is introduced into the substrate. The electrically conductive coupling element may be fabricated for example from polysilicon material, aluminum material or tungsten material.

The molecular electronics arrangement may furthermore have an external circuit, which is coupled to at least one of the first interconnects and/or of the second interconnects by means of the electrically conductive coupling elements. The external circuit is preferably an integrated circuit integrated into the substrate. The external circuit may be fabricated using CMOS technology. The substrate may be a silicon wafer.

By virtue of the fact that, according to the invention, electrically conductive coupling elements are provided by means of which the first and/or second interconnects can be coupled to an external electrical circuit, the molecular electronic molecules can also indirectly be coupled to the external circuit. Consequently, the invention realizes a coupling of molecular electronic molecules to conventional silicon microelectronics. The invention clearly creates an interface between the microscopic dimension of molecular electronic molecules and the macroscopic dimension of conventional silicon microelectronics. By way of example, if the molecular electronic molecules are used as microscopic sensors and/or as microscopic electronic components (e.g. electrical conductors, electrical insulators, diodes, transistors, logic gates), then the molecular electronic molecules can be driven or read out by means of the external circuit and by means of the electrically conductive coupling elements.

The coupling of the molecular electronic molecules to an external circuit is advantageous since this opens up diverse possibilities of application of the molecular electronics arrangement. By way of example, the molecular electronic molecules may be used as a sensor (for example for the presence of an ambient atmosphere or the presence of an ambient temperature).

Furthermore, the molecular electronics arrangement of the invention may also be used as a molecular memory. For this purpose, molecular electronic molecules in the case of which, by way of example, an electrical signal effects a change in a, for example, electrical parameter (e.g. the electrical resistance) may be introduced into the molecular electronics arrangement of the invention. If the electrical resistance of a molecule can optionally be set to a high value or a low value, for example, by application of an external voltage signal, then a molecular electronic molecule may serve as a data memory of one bit. If the molecular electronic molecule is in the state with a high electrical resistance, then this may be interpreted as a logic value "1"; by contrast, if the molecular electronic molecule is in the state with a low electrical resistance, then this may be interpreted as a logic value "0". The bit stored in a molecular electronic molecule may be read out for example by application of a voltage to the molecular electronic molecule, the current flow through the molecular electronic molecule being low if the electrical resistance thereof is large (logic value "1"), and the current flow through the molecular electronic molecule being high if the electrical resistance thereof is small (logic value "0").

The molecular electronics arrangement of the invention affords numerous further possibilities of application. Thus, by way of example, a biomolecule (for example a DNA half strand, a protein, a biopolymer, a low molecular weight compound) coupled to a first interconnect and to a second interconnect may be examined, i.e. characterized, by means of the molecular electronics arrangement. Furthermore, all biological detection methods which are based on making electrical contact with biomolecules can be carried out using the molecular electronics arrangement of the invention. However, a molecular electronic molecule arranged between a first interconnect and a second interconnect may perform an electrical component function, for example be used as an electrical conductor, as an electrical nonconductor, as a diode, as a transistor or as a logic gate.

The diverse possibilities of application of the molecular electronics arrangement of the invention and the associated economic attractiveness of the molecular electronics arrangement are advantageous.

Furthermore, the molecular electronics arrangement of the invention may have at least one protective layer on at least one portion of the uncovered surfaces of the first and/or of the second interconnects. The at least one protective layer is preferably fabricated from one or a combination of the materials silicon dioxide and/or silicon nitride.

Preferably, the entire surface of the first and/or of the second interconnect which cannot be utilized as an active coupling surface for molecular electronic molecules is covered with the protective layer. In other words, preferably the entire surface of the at least one interconnect, which is configured such that it is essentially parallelepipedal, for example, is provided with the protective layer, with the exception of that surface region to which are coupled molecular electronic molecules which are simultaneously coupled to one of the at least one second interconnect. Analogously, there are covered with the protective layer preferably those surface regions of the at least one second interconnect, which is configured such that it is essentially parallelepipedal, for example, which are free of such molecular electronic molecules, which molecular electronic molecules are not only coupled to the second interconnect under consideration by one end section but are furthermore coupled to one of the first interconnects by another end section. As an alternative, however, it is also possible for only individual regions of the surface of the at least one first interconnects or of the at least one second interconnect to be covered with the protective layer.

By virtue of the uncovered surfaces of the at least one first and/or of the at least one second interconnect being at least partly covered with a protective layer preferably fabricated from silicon dioxide and/or from silicon nitride, the invention avoids the situation in which biomolecules couple at such surfaces of the first (and/or respectively the second) interconnects at which the molecular electronic molecules cannot couple to one of the second (and/or respectively the first) interconnects by their other end for geometrical reasons. This is because molecular electronic molecules which are not coupled to one of the first interconnects by one end section and are coupled to one of the second interconnects by their other end section cannot be used as intended. Therefore, such molecules are needlessly lost. By virtue of the free and unutilized surfaces of the interconnects being partly covered with the protective layer, the biomolecules are prevented from binding to these unutilized areas. Costs for molecular electronic molecules coupled to only one interconnect surface are thereby saved. This is advantageous particularly when expensive molecular electronic molecules are intended to be introduced into the molecular electronics arrangement. Biological molecules are often obtainable only in small concentrations and/or volumes, so that in these cases it is a matter of crucial importance to minimize the number of needlessly bound molecular electronic molecules. This is realized by means of the protective layer according to the invention.

This exploits the effect that molecular electronic molecules couple highly selectively only to very specific surfaces. By way of example, it known that thiol groups (SH radicals) couple particularly well to gold surfaces. Furthermore, thiol groups, as occur at the end sections of many molecular electronic molecules, also couple to platinum or silver surfaces. Furthermore, trichlorosilane radicals ($SiCl_3$ groups) adhere well to silicon, aluminum and titanium. Trichlorosilane radicals also adhere well to various oxides, so that molecular electronic molecules with trichlorosilane end groups can also be coupled to conductors whose surface has a thin oxide layer. This consideration shows that the material of the protective layer is to be chosen such that the molecular electronic molecules do not bind, or bind only poorly, to said material. Silicon dioxide and/or silicon nitride are suitable as materials for the protective layer.

The at least one first interconnect or the at least one second interconnect is preferably fabricated from one or a combination of the materials gold, platinum, silver, silicon, aluminum and titanium. These materials are suitable for binding to end groups (in particular thiol groups or trichlorosilane radicals) which often occur in molecular electronic molecules.

The spacer is preferably fabricated from one or a combination of the materials silicon dioxide and/or silicon nitride. By using these materials for the spacer, with reference to the explanations above, the invention avoids the situation in which molecular electronic molecules couple parasitically to the surface of the spacer. Therefore, the spacer, if it is fabricated from a suitable material, may support the functionality of the protective layer or serve as a protective layer.

As explained above, the two-sided coupling of the molecular electronic molecules to the interconnects is for example by means of a thiol-gold coupling and/or a coupling of a trichlorosilane radical to one of the materials silicon, aluminum and titanium.

Preferably, in the molecular electronics arrangement of the invention, at least a portion of the molecular electronic molecules are redox-active bispyridinium molecules and/or alkyltrichlorosilane molecules.

The method according to the invention for fabricating a molecular electronics arrangement is described below. In the method according to the invention for fabricating a molecular electronics arrangement of the invention, in a first step, at least one first interconnect, which has a surface, is introduced into or applied to the surface of a substrate. In a second step, a spacer layer is applied to the surface of the at least one first interconnect, which spacer layer at least partly covers the surface of the at least one first interconnect. In a third step, at least one second interconnect, which has a surface areally opposite the surface of the at least one first interconnect, is applied to the spacer layer, a distance between the at least one first interconnect and the at least one second interconnect being prescribed by means of the spacer layer. In a fourth step, the spacer is formed by the spacer layer being partly etched back, in such a way that an uncovered region of the surface of the at least one first interconnect and an uncovered region of the surface of the at least one second interconnect remains. In a fifth step, molecular electronic molecules are arranged between the uncovered region of the surface of the at least one first interconnect and the uncovered region of the surface of the at least one second interconnect, the length of which molecules is equal to the distance between the at least one first interconnect and the at least one second interconnect.

As described above, in the first step, at least one first interconnect, which has a surface, is introduced into or applied to the surface of a substrate.

Preferably, the at least one first interconnect is introduced into the surface of the substrate using damascene technology. The damascene technique is a method which makes it possible to produce a trench filled with a metal material in a substrate. In this case, firstly the substrate into which the metal material is intended to be introduced is planarized for example using the CMP technique ("Chemical Mechanical Polishing"). At least one trench is then etched into the substrate into which the metal material is intended to be introduced. Afterward, metal material is deposited into the at least one trench. The conductor material projecting beyond the trenches is then removed by polishing once again using the CMP method ("Chemical Mechanical Polishing"), so that only the metallized trench filling remains. In this way, only the top side of the metallic interconnect is uncovered. It should be added that the metallic material can be introduced into the trench for example by using the sputtering method or by CVD deposition ("Chemical Vapor Deposition").

As described above, the at least one first interconnect is preferably introduced, i.e. integrated, into the surface of a substrate. This is advantageous since this enables the coupling to a conventional microelectronic silicon circuit integrated for example into the substrate.

In the second method step according to the invention, a spacer layer is applied to the surface of the at least one first interconnect, which spacer layer at least partly covers the surface of the at least one first interconnect.

Preferably, the spacer layer is applied to the surface of the layer arrangement by means of the atomic layer deposition method (ALD method). Clearly, the distance between the at least one first interconnect and the at least one second interconnect is defined by means of the thickness of the spacer layer, the thickness of the spacer layer essentially corresponding to the distance between the two molecular docking sites. In order to be able to precisely set this distance with an accuracy of the order of magnitude of atomic distances (i.e. distances in the range of a few angstroms), the method of atomic layer deposition (ALD method) is preferably used for depositing the spacer layer onto the at least one interconnect. The ALD method is a technique for depositing thin layers onto a surface and is related to the CVD method ("Chemical Vapor Deposition"). The ALD method is clearly a CVD method in which an atomic layer is in each case deposited onto a surface by alternately introducing two reaction gases into a process space. Firstly, a first reaction gas is introduced into a process space, so that firstly an atomic layer of a material which is determined by the first reaction gas is deposited on the surface of the substrate that is to be covered with a layer. Afterward, a second reaction gas is introduced into the process space, so that there is deposited on the monoatomic layer determined by the material of the first reaction gas a further monoatomic layer determined by the material of the second reaction gas. Monoatomic layers defined by the materials of the first reaction gas and of the second reaction gas, respectively, are gradually deposited on the surface of the layer arrangement. A layer having a very uniform thickness is produced in this way, it being possible for the thickness to be set to an accuracy of one atomic layer, i.e. to the accuracy of a few angstroms, by the number of process steps. The exact setting of the thickness of the layer can be realized by simple counting of the number of process steps.

By virtue of the spacer layer being applied to the at least one first interconnect using the ALD method, the distance between the at least one first interconnect and the at least one second interconnect can be adjusted exactly and can thus be adapted flexibly to specific molecular electronic molecules that are to be introduced. This is just as advantageous as the high degree of reproducibility which is achieved for example by counting the process steps, i.e. the alternation from a first reaction gas to a second reaction gas. Preferably, the spacer layer is fabricated from one or a combination of the materials silicon dioxide and silicon nitride.

In a third method step, at least one second interconnect, which has a surface areally opposite the surface of the at least one first interconnect, is applied to the spacer layer, the distance between the at least one first interconnect and the at least one second interconnect being prescribed by means of the spacer layer.

This step may be realized in practice by depositing and patterning an electrically conductive layer on the surface of the layer arrangement obtained. This may be done for example by means of a suitable photolithography and etching method.

The at least one first interconnect and/or the at least one second interconnect may be fabricated from one or a combination of the materials gold, platinum, silver, silicon, aluminum and titanium.

In a fourth step, the spacer is formed by the spacer layer being partly etched back, in such a way that an uncovered region of the surface of the at least one first interconnect and an uncovered region of the surface of the at least one second interconnect remains.

This method step may be realized for example by the spacer layer being partly etched away using a suitable etching method, for example by means of wet-chemical etching, so that at least one spacer remains. Preferably, the spacer is undercut, i.e. the spacer situated beneath the at least one second interconnect is laterally etched back to an extent such that the at least one second interconnect projects at least partly laterally above the spacer, and that the at least one first interconnect arranged beneath the spacer projects laterally at least partly above the spacer. A region of the surface of the at least one first interconnect and a region of the surface of the at least one second interconnect are thereby uncovered. Clearly, the two areas of the at least one first interconnect and at least one second interconnect to which a molecular electronic molecule can be coupled on both sides lie approximately parallel opposite one another, at a distance from one another which essentially corresponds to the length of a molecular electronic molecule to be introduced.

In a fifth method step, molecular electronic molecules are arranged between the uncovered region of the surface of the at least one first interconnect and the uncovered region of the surface of the at least one second interconnect, the length of which molecules is equal to the distance between the at least one first interconnect and the at least one second interconnect.

As explained above, there are specific material pairs of conductor surfaces and end sections of molecular electronic molecules which bind particularly well with one another, for example the thiol-gold bond. If the surface of the at least one first interconnect and, respectively, at least one second interconnect uncovered in accordance with the method is fabricated from a material (for example gold) which is sufficiently well suited to the binding of specific molecular electronic molecules (for example those which have thiol end groups), then the molecular electronic molecules will spontaneously couple to one of the first interconnects by one end section and to one of the second interconnects by the other end section. For this purpose, by way of example, the molecular electronic molecules are introduced in dissolved form into the molecular electronics arrangement, and a bond forms automatically (so-called self-assembly technique).

The molecular electronic molecules are preferably redox-active bispyridinium molecules and/or alkyltrichlorosilane molecules.

As shown by the description above, the molecular electronics arrangement of the invention can be fabricated by a method whose method steps are standard semiconductor-technological method steps. By virtue of the fact that in accordance with the method, exclusively standard techniques can be used which can be carried out on standardized machines as are available in many semiconductor-technological laboratories and factories, there is no need for a complicated development of machines for realizing the method for fabricating a molecular electronics arrangement. This saves time and development costs.

Furthermore, it is possible in accordance with the method to bring about a large multiplicity of couplings between a first interconnect and a second interconnect by means of molecular electronic molecules with the result that, in contrast to the molecular electronics arrangements known from the prior art, the molecular electronics arrangement of the invention is also suitable for industrial scale integration. Thus, the molecular electronics arrangement of the invention is not only of interest for laboratory experiments in pure research, but also opens up areas of application that are of economic interest for molecular electronics.

The method for fabricating a molecular electronics arrangement may have the further method step that at least one of the first interconnects and/or at least one of the second interconnects are coupled to at least one electrically conductive coupling element, so that the interconnects can be coupled to an external circuit. This may be realized in particular by a procedure in which the electrically conductive coupling elements are formed by introducing contact holes into the substrate and filling the contact holes with an electrically conductive material. Preferably, the electrically conductive coupling elements are fabricated from polysilicon material, aluminum material or tungsten material.

Furthermore, at least one portion of the first and/or of the second interconnects may be coupled to an electrical circuit by means of the electrically conductive coupling elements. The external circuit is preferably integrated into the substrate. By way of example, the external circuit may be integrated into the substrate by means of CMOS technology. By way of example, a silicon wafer may be used as the substrate.

This realizes a coupling of the molecular electronic molecules to external conventional silicon microelectronics, which opens up many areas of application for the molecular electronics arrangement fabricated in accordance with the method.

The method for fabricating a molecular electronics arrangement may furthermore have, before the introduction of the molecular electronic molecules into the arrangement, the further method step that at least one protective layer is applied to at least one portion of the uncovered regions of the surfaces of the first and/or of the second interconnects. The protective layer is preferably fabricated from one or a combination of the materials silicon dioxide and/or silicon nitride.

As explained in detail above, the formation of a protective layer on a portion of the uncovered surfaces of the first interconnects to which are bound no molecular electronic molecules which are furthermore also bound to one of the second interconnects reduces the number of those molecular electronic molecules which cannot be used as intended. Analogously, the formation of the protective layer at surface regions of the at least one second interconnect which are suitable therefor reduces the number of those molecular electronic modules which couple to the uncovered surfaces of the at least one second interconnects without at the same time being coupled to one of the at least one first interconnect by another end section. Clearly, the formation of the protective layer has the effect that a higher proportion of the molecular electronic molecules introduced into the molecular electronics arrangement couple as intended on both sides to one of the first and, respectively, one of the second interconnects. As a result, fewer molecular electronic modules are required, which reduces the costs and which enables the defined introduction of such molecular electronic molecules which are available only in very low concentration.

As an alternative, in accordance with the method according to the invention for fabricating a molecular electronics arrangement, instead of the application of the at least one second interconnect to the spacer layer, a continuous conductor layer and also a further protective layer are applied to the arrangement of the surface, and the continuous conductor layer and the further protective layer are patterned in such a way that an at least one second interconnect at least partly covered with a further protective layer is thereby formed. The further protective layer is preferably fabricated from one or a combination of the materials silicon dioxide and silicon nitride.

A further refinement of the method according to the invention for fabricating the molecular electronics arrangement of the invention consists in the fact that, during the introduction of the molecular electronic molecules into the arrangement, electrical voltages are applied at least to a portion of the interconnects, in such a way that the molecular electronic molecules are coupled with a preferred geometrical orientation to one of the at least one first interconnects and to one of the at least one second interconnects.

The electrical signals necessary for this are preferably provided by the external circuit which is coupled to the interconnects via electrically conductive coupling elements. Clearly, an electric field is formed by electrical voltages applied between the first interconnects and the second interconnects. If molecular electronic molecules are now introduced into the arrangement, these molecular electronic molecules are influenced by the electric field provided that the molecular electronic molecules have an electrical multipole moment, that is to say are electrically charged, for example. Thus, by way of example, many proteins at physiological pH values have an electrical charge which originates from charged amino acids predominantly at the surface of the protein molecules. DNA molecules may also have an electrical charge; DNA half strands often have a negative electrical charge. On account of the electric field generated by the electrical voltages applied to the interconnect, an electrical force acts on the electrically charged molecular electronic molecules. These bring the electrically charged molecular electronic molecules preferably into a geometrical orientation in which the potential energy of the molecular electronic molecules in the electric field is minimal. As a result, a preferred direction is prescribed for the molecular electronic molecules when coupling on both sides to one of the at least one first interconnect and one of the at least one second interconnects, which increases the degree of order of the arrangement. This has the advantage of a particularly high reproducibility.

Exemplary embodiments of the invention are illustrated in the figures and are explained in more detail below.

BRIEF DESCRIPTION OF THE DRAWINGS

Exemplary embodiments of the invention are shown in the figures and are described in more detail in the following, in which:

FIG. 4A shows a cross-sectional view of a layer arrangement after a first method section in accordance with a preferred exemplary embodiment of the method according to the invention for fabricating a molecular electronics arrangement, FIG. 4B shows a cross-sectional view of a layer arrangement after a second method section in accordance with a preferred exemplary embodiment of the method according to the invention for fabricating a molecular electronics arrangement, FIG. 4C shows a cross-sectional view of a layer arrangement after a third method section in accordance with a preferred exemplary embodiment of the method according to the invention for fabricating a molecular electronics arrangement, FIG. 4D shows a cross-sectional view of a layer arrangement after a fourth method section in accordance with a preferred exemplary embodiment of the method according to the invention for fabricating a molecular electronics arrangement, FIG. 4E shows a cross-sectional view of a layer arrangement after a fifth method section in accordance with a preferred exemplary embodiment of the method according to the invention for fabricating a molecular electronics arrangement.

DETAILED DESCRIPTION

Figure 1A:
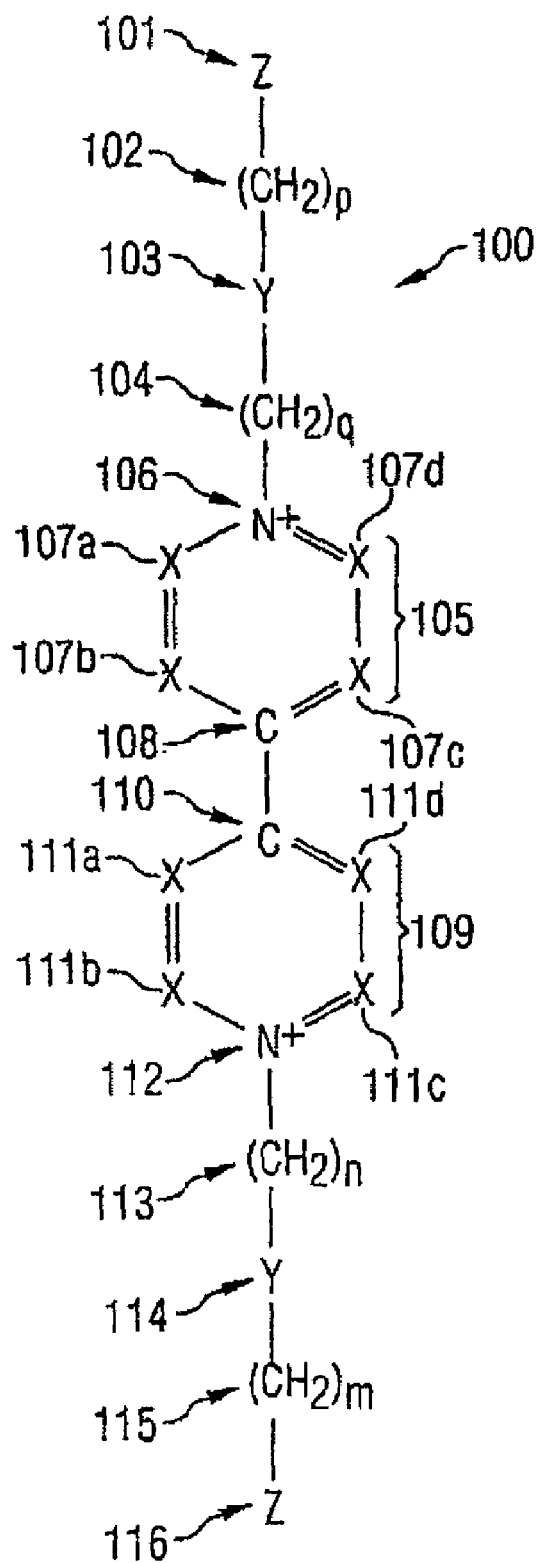
FIG. 1A shows the chemical structure of a bispyridinium molecule.
Figure 1B:
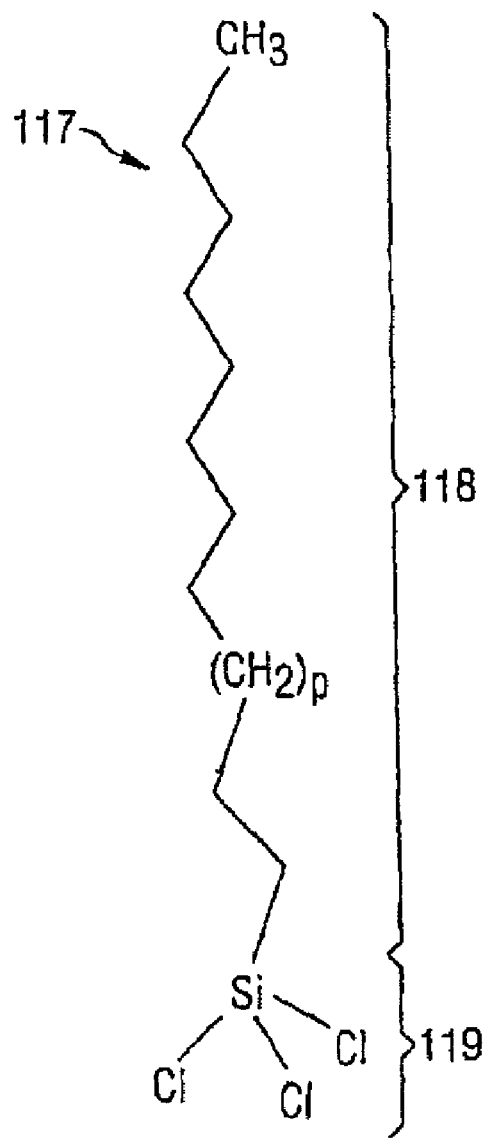
FIG. 1B shows the chemical structure of an alkyltrichlorosilane molecule.

Firstly, a description is given, with reference to FIGS. 1A–1B, of exemplary embodiments of molecular electronic molecules as are included in the molecular electronics arrangement of the invention.

The structure of redox-active bispyridinium molecules 100 is described below with reference to FIG. 1A. As disclosed in [2], the electrical resistance of redox-active bispyridinium molecules 100 can be switched back and forth between two values, the electrical resistance being low in the reduced redox state and the electrical resistance being high in the oxidized redox state.

The redox-active bispyridinium molecule 100 shown in FIG. 1A has a few substituents (designated by X, Y, Z) which serve as spacers for a chemical element or a chemical group or for a molecule radical. Furthermore, variables p, q, n, m are shown in the bispyridinium molecule 100 shown in FIG. 1A, each of which variables assumes an integral positive value (1, 2, 3, . . . ) independently of one another.

The bispyridinium molecule 100 shown in FIG. 1A has a first substituent 101, which is designated by Z and is coupled to a first alkyl group 102. The first alkyl group 102 is furthermore coupled to a second substituent 103 designated by Y, and the second substituent 103 is furthermore coupled to a second alkyl group 104. The second alkyl group 104 is furthermore coupled to a first nitrogen ion 106, which first nitrogen ion 106 is part of the first six-membered ring 105.

The first six-membered ring 105 has a honeycomb-like structure of six components that are closed to form a ring; inter alia, the first six-membered ring 105 has four third substituents 107a, 107b, 107c, 107d. The positively charged nitrogen ion 106 is coupled to the first of the third substituents 107a, the first of the third substituents 107a is coupled to the second of the third substituents 107b, the second of the third substituents 107b is coupled to a first carbon atom 108, the first carbon atom 108 is coupled to the third of the third substituents 107c, the third of the third substituents 107c is coupled to the fourth of the third substituents 107d and the fourth of the third substituents 107d is coupled to the nitrogen ion 106, as a result of which the annular arrangement of the atoms or molecules 106, 107a, 107b, 108, 107c, 107d is closed. The first of the third substituents 107a, the second of the third substituents 107b, the third of the third substituents 107c and the fourth of the third substituents 107d are in each case designated by the spacer X. As is further shown in FIG. 1A, the first carbon atom 108 of the first six-membered ring 105 is coupled to a second carbon atom 110 of a second six-membered ring 109. The second six-membered ring 109, like the first six-membered ring 105, has an annular structure of six atoms or molecules; inter alia, the second six-membered ring 109 has four fourth substituents 111a, 111b, 111c, 111d. The second carbon atom 110 is coupled to the first of the fourth substituents 111a, the first of the fourth substituents 111a is coupled to the second of the fourth substituents 111b, the second of the fourth substituents 111b is coupled to a second nitrogen ion 112, the second nitrogen ion 112 is coupled to the third of the fourth substituents 111c, the third of the fourth substituent 111c is coupled to the fourth of the fourth substituents 111d and the fourth of the fourth substituents 111d is coupled to the second carbon atom 110 in order to close the annular structure of the second six-membered ring 109. The first of the fourth substituents 111a, the second of the fourth substituents 111b, the third of the fourth substituents 111c and the fourth of the fourth substituents 111d are in each case designated by the spacer X. The second nitrogen ion 112 is furthermore coupled to a third alkyl group 113, and the third alkyl group 113 is furthermore coupled to a fifth substituent 114, which is designated by the spacer Y in accordance with FIG. 1A. The fifth substituent 114 is coupled to a fourth alkyl group 115 and the fourth alkyl group 115 is coupled to a sixth substituent 116. The sixth substituent 116 is designated by the spacer Z. The first substituent 101 and the sixth substituent 116 represent two end sections of the bispyridinium molecule 100.

Preferably, each of the spacers X denotes a CH group, a CR group, a nitrogen atom, an oxygen atom or a sulfur atom. The letter R in the abovementioned CR group itself again represents a spacer, which preferably represents an alkyl group, an aryl group, a benzyl group, a CN group, a COOH group, a COOR' group, a CONHR' group, an $NO_2$ group, an OH group, an OR' group, an $NH_2$ group, an NHR' group, an NR'R" group, an SH group, an SR' group or another chemically suitable element or another chemically suitable radical. R' and R" in turn designate any desired chemically suitable radicals or groups, for example alkyl groups.

Furthermore, each of the spacers Y designates a $CH_2$ group, an oxygen atom, an NH group, an NR' group, a COO group, a CONH group, a CH=CH group, a C≡C group, an aryl group or another chemically suitable element or another chemically suitable radical. R' in turn designates any desired chemically suitable radicals or groups, for example alkyl groups.

Furthermore, each of the spacers Z denotes a $CH_3$ group, a $CH=CH_2$ group, an SH group, a sulfur—sulfur group, an $SiCl_3$ group, an $Si(OR')_3$ group, an $SiR_2(OR')$ group, a $PO_3H$ group or another chemically suitable element or another chemically suitable radical. R' in turn designates any desired chemically suitable radicals or groups, for example alkyl groups.

It should again be pointed out that the variables m, n, p, q may be any positive integer independently of one another.

FIG. 1A shows a bispyridinium molecule 100 having a series of double bonds (e.g. within the first six-membered ring 105). For specific combinations of substituents, single bonds may result instead of said double bonds, e.g. if divalent oxygen is chosen for the spacer X.

In accordance with a preferred exemplary embodiment of the invention, the bispyridinium molecule 100 has end sections Z 101, 116 which are thiol groups (SH radicals). It is known that thiol groups immobilize particularly well on gold surfaces.

As a second example of a molecular electronic molecule, an alkyltrichlorosilane molecule 117 is shown in FIG. 1B. This molecule has an alkyl group 118 and a trichlorosilane radical ($SiCl_3$ group) 119. The alkyl group 118 has a $CH_3$ group in an end section of the alkyltrichlorosilane molecule 117 and furthermore has p $CH_2$ groups arranged in series. In this case, the variable p may again be any integral positive number. The alkyl group 118 is coupled to a trichlorosilane radical 119, the trichlorosilane radical 119 being situated at the other end section of the alkyltrichlorosilane molecule 117. It is known that trichlorosilane radicals 119 can be coupled particularly well to silicon, aluminum and titanium. Furthermore, trichlorosilane radicals 119 can also be coupled to various oxides. In order to realize such a coupling, it is possible to use for example a thin surface layer of an oxide on a conductor.

It must be emphasized that the molecules 100, 117 which are shown in FIG. 1A, FIG. 1B and are described above are mentioned only as examples of possible molecular electronic molecules which the molecular electronics arrangement of the invention may have. The molecular electronics arrangement of the invention may furthermore have molecular electronic molecules which are, by way of example, proteins, DNA half strands, DNA molecules, low molecular weight compounds, polypeptides, polymers or other suitable chemical compounds. Nanotubes, in particular carbon nanotubes, may also be used as molecular electronic molecules.

Figure 2A:
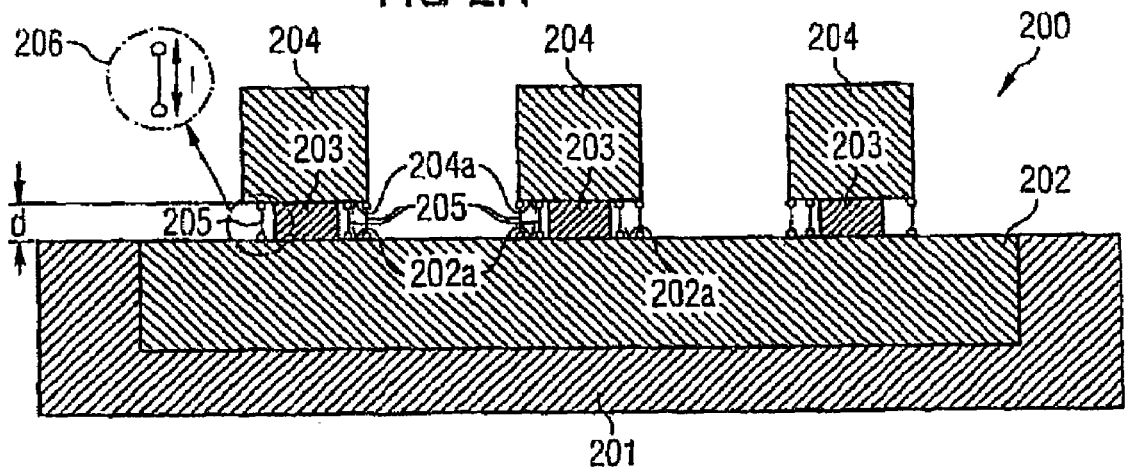
FIG. 2A shows a cross-sectional view of a molecular electronics arrangement in accordance with a first exemplary embodiment of the invention.

FIG. 2A shows a molecular electronics arrangement 200 in accordance with a first preferred exemplary embodiment of the invention.

The molecular electronics arrangement 200 has a substrate 201, at least one first interconnect 202, which has a surface 202a and which is arranged in the substrate 201, a spacer 203 arranged on the surface 202a of the at least one first interconnect 202, which spacer partly covers the surface 202a of the at least one first interconnect 202, at least one second interconnect 204 arranged on the spacer 203, which interconnect has a surface 204a areally opposite the surface 202a of the at least one first interconnect 202, the spacer 203 partly covering the surface 204a of the at least one second interconnect 204, and a predetermined distance between the at least one first interconnect 202 and the at least one second interconnect 204 being defined by means of the spacer 203, and molecular electronic molecules 205 arranged between an uncovered region of the surface 202a of the at least one first interconnect 202 and an uncovered region of the surface 204a of the at least one second interconnect 204, the length of which molecules is equal to the distance between the at least one first interconnect 202 and the at least one second interconnect 204.

Furthermore, FIG. 2A shows an enlarged illustration of a molecular electronic molecule 206. The length of the molecular electronic molecule is designated by "l" in this enlarged illustration of a molecular electronic molecule 206. Furthermore, FIG. 2A shows the thickness "d" of the spacer 203, which defines a predetermined distance "d" between the at least one first interconnect 202 and the at least one second interconnect 204.

In accordance with the exemplary embodiment shown in FIG. 2A, the substrate 201 is a preprocessed silicon wafer, the at least one first interconnect 202 and the at least one second interconnect 204 are fabricated from gold material, and the spacer 203 is fabricated from silicon dioxide material. In accordance with the exemplary embodiment of the molecular electronics arrangement 200 as shown in FIG. 2A, the molecular electronic molecules 205 are bispyridinium molecules. The two-sided coupling of the bispyridinium molecules to the interconnects 202, 204 is realized as thiol-gold coupling. As is further shown in FIG. 2A, the molecular electronic molecules 205 are coupled to one of the first interconnects and to one of the second interconnects at two of their end sections, which is made possible by virtue of the fact that the thickness "d" of the spacer 203 is essentially equal to the length "l" of the molecular electronic molecules 205.

Figure 2B:
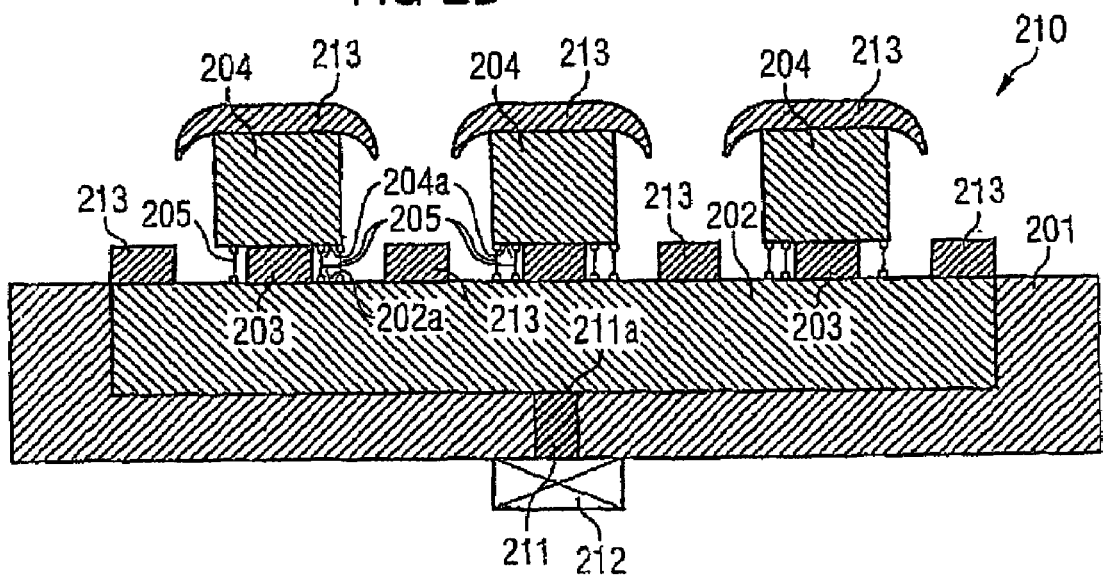
FIG. 2B shows a cross-sectional view of a molecular electronics arrangement in accordance with a second exemplary embodiment of the invention.

FIG. 2B shows a molecular electronic arrangement 210 in accordance with a second preferred exemplary embodiment of the invention.

The molecular electronics arrangement 210 shown in FIG. 2B has the features of the molecular electronics arrangement 200, and the molecular electronics arrangement 210 furthermore has further features. Each of the first interconnects 202 and each of the second interconnects 204 is in each case coupled to an electrically conductive coupling element 211, by means of which the interconnects 202, 204 can be coupled to an external circuit. FIG. 2B shows only the electrically conductive coupling element 211 coupled to the first interconnect 202. However, each of the second interconnects 204 shown in FIG. 2B is also in each case coupled to an electrically conductive coupling element (not shown in FIG. 2B). In accordance with the exemplary embodiment of the molecular electronics arrangement 210 as shown in FIG. 2B, the electrically conductive coupling element 211 is a contact hole 211a filled with an electrically conductive material, which contact hole 211a is introduced into the substrate 201. The electrically conductive coupling element 211 is fabricated from tungsten material in accordance with the exemplary embodiment described.

Furthermore, the molecular electronics arrangement 210 has an external circuit 212, which is coupled to the first interconnects 202 and the second interconnects 204 by means of the electrically conductive coupling elements 211. The coupling of the first interconnect 202 to the external circuit 212 is depicted in FIG. 2B and is effected via the electrically conductive coupling element 211. The three second interconnects 204 shown in FIG. 2B are also coupled to the external circuit 212 by means of electrically conductive coupling elements (not shown in FIG. 2B). Consequently, according to the invention, the circuit 212, which is a conventional microelectronic circuit, is coupled to the molecular electronic molecules 205 via the coupling element 211 and the interconnects 202, 204.

Furthermore, the molecular electronics arrangement 210 has a protective layer 213 on a portion of the uncovered surfaces of the first interconnects 202 and of the second interconnects 204. In accordance with the exemplary embodiment of the molecular electronics arrangement 210 as shown in FIG. 2B, the protective layer 213 is fabricated from silicon dioxide material.

In accordance with FIG. 2B, the protective layer 213 has seven partial sections, three cap-like coverings of the second interconnects 204 and four parallelepipedal coverings of the first interconnect 202. As shown in FIG. 2B, those surface regions of the first interconnect 202 and, respectively, of the second interconnect 204 on which the protective layer 213 is applied are not suitable regions for binding molecular electronic molecules 205 thereto in such a way that the molecular electronic molecules 205 are coupled to a first interconnect 202 by one end section and to a second interconnect 204 by the other end section. The surface regions of the first and second interconnects 202, 204 which are covered with the protective layer 213 are therefore unsuitable for the two-sided binding of molecular electronic molecules 205 since, proceeding from these surfaces, a further interconnect is not arranged at a distance "d" corresponding to the length "l" of the molecular electronic molecules 205 in order to provide the second coupling site. All the molecular electronic molecules 205 which dock at such surfaces of the first and second interconnects 202, 204 cannot be used as intended. The electrical protective layer 213 therefore serves to avoid the binding of molecular electronic molecules 205 to unsuitable surface regions of the first and second interconnect 202, 204.

Figure 2C:
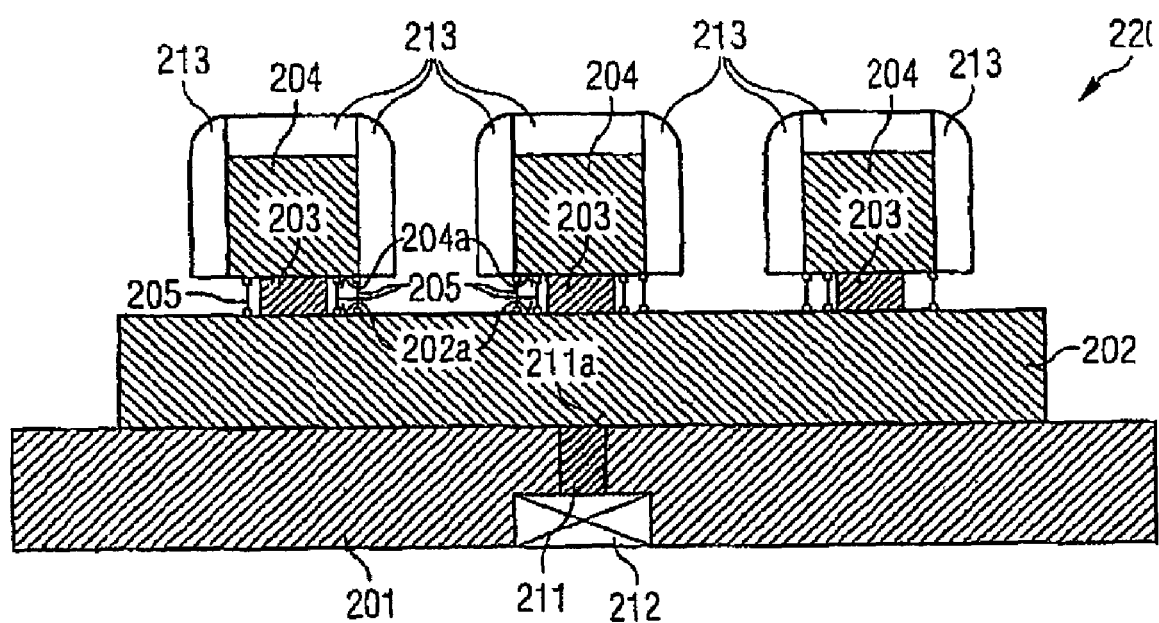
FIG. 2C shows a cross-sectional view of a molecular electronics arrangement in accordance with a third exemplary embodiment of the invention.

FIG. 2C shows a molecular electronics arrangement 220 in accordance with a third preferred exemplary embodiment of the invention. The molecular electronics arrangement 220 shown in FIG. 2C differs from the molecular electronics arrangement 210 shown in FIG. 2B essentially in respect of the following aspects.

Firstly, the first interconnect 202 is arranged on the substrate 201 in accordance with the exemplary embodiment of the molecular electronics arrangement 220 as shown in FIG. 2C, and is not integrated in the substrate 201 as in accordance with the exemplary embodiment of the molecular electronics arrangement 210 as shown in FIG. 2B.

Furthermore, in accordance with the molecular electronics arrangement 220, the external circuit 212 is provided as an integrated circuit which is introduced into the substrate 201. The external circuit 212 is fabricated using CMOS technology.

The protective layer 213 is fabricated from silicon nitride material in accordance with the exemplary embodiment of the molecular electronics arrangement 220 as shown in FIG. 2C. The protective layer 213 from FIG. 2C has three partial regions, each of these three partial regions of the protective layer 213 being applied on one of the three second interconnects 204 in order to envelop the latter essentially in a U-shaped manner. According to FIG. 2C, the first interconnect 202 is free of a protective layer 213.

Figure 3A:
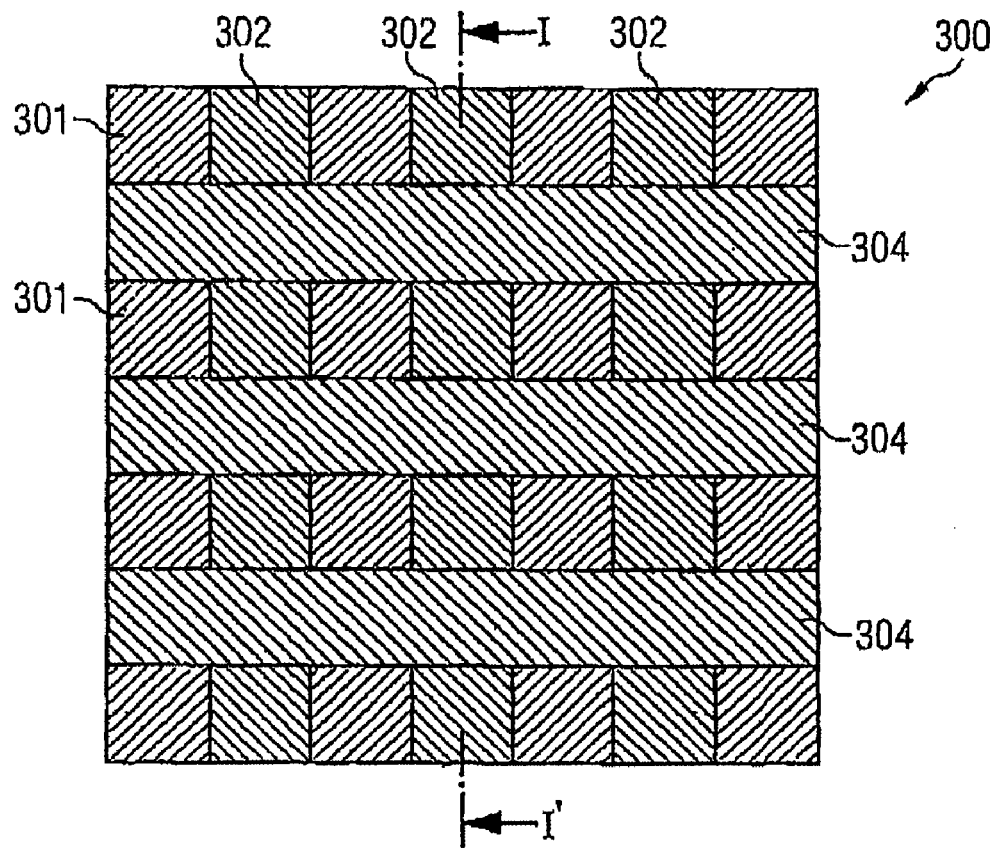
FIG. 3A shows a plan view of a molecular electronics arrangement in accordance with an exemplary embodiment of the molecular electronics arrangement according to the invention for use as a molecular memory.
Figure 3B:
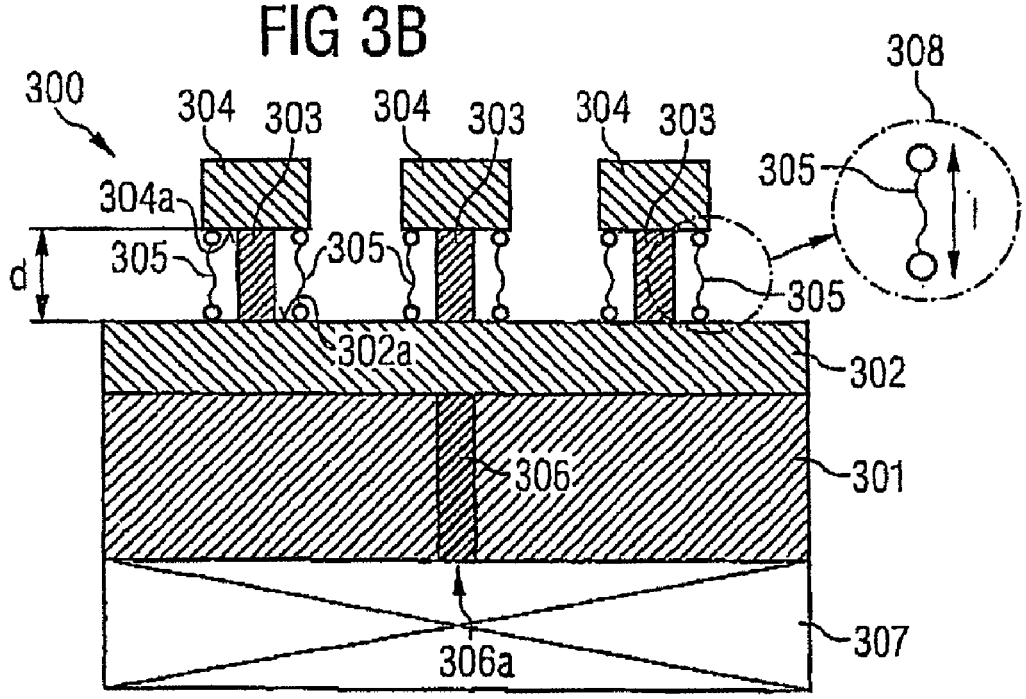
FIG. 3B shows a cross section along the section line I–I' from FIG. 3A of a molecular electronics arrangement in accordance with the exemplary embodiment of the molecular electronics arrangement according to the invention for use as a molecular memory.

FIG. 3A shows a plan view and FIG. 3B a cross-sectional view along the section line I–I' of a molecular electronics arrangement 300 in accordance with an exemplary embodiment of the molecular electronics arrangement according to the invention for use as a molecular memory. The molecular electronics arrangement 300 has a substrate 301, three first interconnects 302, which have a surface 302a and which are arranged in the substrate 301, a spacer 303 arranged on the surface 302a of the three first interconnects 302, which spacer partly covers the surface 302a of the three first interconnects 302, three second interconnects 304, which are arranged on the spacer 303 and have a surface 304a areally opposite the surface 302a of the three first interconnects 302, the spacer 303 partly covering the surface of the three second interconnects 304, and a predetermined distance between the three first interconnects 302 and the three second interconnects 304 being defined by means of the spacer 303, and molecular electronic molecules 305 arranged between an uncovered region of the surface 302a of the three first interconnects 302 and an uncovered region of the surface 304a of the three second interconnects 304, the length of which molecules is equal to the distance between the three first interconnects 302 and the three second interconnects 304. Furthermore, in accordance with the molecular electronics arrangement 300, the three first interconnects 302 and the three second interconnects 304 are in each case coupled to an electrically conductive coupling element 306, by means of which the interconnect 302, 304 can be coupled to an external circuit 307. The electrically conductive coupling elements 306 coupled to the three second interconnects 304 are not shown in FIG. 3A, FIG. 3B. One of the three coupling elements 306 by means of which the three first interconnects 302 can be coupled to an external circuit are shown in FIG. 3B and are contact holes 306a filled with an electrically conductive material, which contact holes 306a are introduced into the substrate 301. Furthermore, FIG. 3B shows an external circuit 307, which is coupled to the three first interconnects 302 and the three second interconnects 304 by means of the electrically conductive coupling elements 306.

The enlarged illustration of a molecular electronic molecule 308 depicted in FIG. 3B reveals that the molecular electronic molecules 305 have a length "l". This length "l" of the molecular electronic molecules 305 is essentially equal to the distance "d" between the first interconnects 302 and the second interconnects 304, this thickness "d" being prescribed by the thickness of the spacer 303.

In accordance with the exemplary embodiment of the molecular electronics arrangement 300 according to the invention as shown in FIG. 3A, FIG. 3B, which arrangement can be used as a molecular memory, the molecular electronic molecules 305 are bispyridinium molecules.

The principle of how the molecular electronics arrangement 300 can be used as molecular memory is described below. As shown in FIG. 3A, the molecular electronics arrangement 300 is, in plan view, essentially a grid formed by two interconnects 302, 304 arranged in crossed fashion one above the other. In each crossover region between one of the first and one of the second interconnects 302, 304, redox-active bispyridinium molecules 305 are introduced, by means of which one of the first interconnects 302 is coupled to one of the second interconnects 304 i.e. the interspace is bridged. As described above, the bispyridinium molecules 305 have the property that they can be present in an oxidized state and in a reduced state. The bispyridinium molecules 305 have a high electrical resistance in the oxidized state, whereas the bispyridinium molecules 305 have a low electrical resistance in the reduced state. By applying a sufficiently large voltage between the two end sections of a bispyridinium molecule 305, the bispyridinium molecule 305 can be reversibly switched back and forth between the two redox states. Once again with reference to FIG. 3B, it is possible, by way of example, for a voltage provided by the external circuit 307 to be applied between one of the first interconnects 302 and one of the second interconnects 304, and a voltage is then also present between the thiol end groups of the bispyridinium molecule 305. By applying such a suitable voltage, it is therefore possible, in each crossover region between one of the first interconnects 302 and one of the second interconnects 304, for a bispyridinium molecule 305 arranged in said crossover region to be switched back and forth between its two redox states. In other words, through a suitably chosen voltage, it is possible to establish whether a bispyridinium molecule 305 is present in an oxidized state with a high electrical resistance or in a reduced state with a low electrical resistance. In this way, each crossover region between one of the first interconnect 302 and one of the second interconnect 304 may be regarded as a molecular memory with a data quantity of one bit, which, by applying a sufficiently high voltage, can be allocated a logic value "1" (oxidized, high electrical resistance) or "0" (reduced, low electrical resistance). Thus, a total of nine bits can be stored in accordance with the exemplary embodiment of the molecular electronics arrangement 300 as shown in FIG. 3A and FIG. 3B. Thus, by way of example, in a crossover region between one of the first interconnects 302 and one of the second interconnects 304, a bispyridinium molecule 305 arranged in between may be brought to the reduced redox state, so that this bispyridinium molecule 305 has a low electrical resistance. As an alternative, in a crossover region between one of the first interconnects 302 and one of the second interconnects 304, a bispyridinium molecule 305 may be brought to the oxidized redox state, so that the bispyridinium molecule 305 has a high electrical resistance. A bispyridinium molecule 305 in a state with a high electrical resistance may then be interpreted for example as a bit with a logic value "1", and a bispyridinium molecule 305 in a state with a low electrical resistance may be regarded for example as a bit with a logic value "0". Therefore, what is realized according to the invention is that a data quantity of one bit can be stored in each crossover region between one of the first interconnects 302 and one of the second interconnects 304.

A description is given below of how the data quantity of one bit stored in each crossover region between one of the first interconnects 302 and one of the second interconnects 304 can be read out. If an electrical voltage is applied between one of the first interconnects 302 and one of the second interconnects 304 by means of the external circuit 307, then the current flow through the bispyridinium molecules 305 which are introduced between the two interconnects 302, 304 depends on the magnitude of the electrical resistance of the bispyridinium molecules 305. If the bispyridinium molecules 305 have previously been brought to an oxidized state with a high electrical resistance, then the current flow is low. By contrast, if the bispyridinium molecules 305 have previously been put into a reduced state with a low electrical resistance, then, in accordance with Ohm's law, the current flow through the bispyridinium molecules 305 is high. In accordance with the statements above, a high current flow may be interpreted as a bit with a logic value "0", and, in accordance with the statements above, a low current flow may be interpreted as a bit with a logic value "1". The data quantity of one bit that can be stored in each crossover region between one of the first interconnects 302 and one of the second interconnects 304 can be read out in the manner described.

The data quantity stored in the crossover regions between the first interconnects 302 and the second interconnects 304 can be erased for example by applying to all the crossover regions between the corresponding first interconnects 302 and the corresponding second interconnects 304 electrical voltages such that all the bispyridinium molecules 305 are brought e.g. to the reduced state with a high electrical conductivity, which corresponds to a logic value "0". As a result, all the bits are reset to the logic value "0", i.e. the information is erased.

It must be emphasized that one or a plurality of bispyridinium molecules 305, each of which can be reversibly switched back and forth between an oxidized, electrically poorly conductive state and a reduced, electrically readily conductive state, may be introduced in each crossover region between one of the first interconnects 302 and one of the second interconnects 304.

Furthermore, a protective layer 213, as are shown for example in the molecular electronics arrangements 210 and 220 from FIG. 2B and FIG. 2C, respectively, is not provided in the molecular electronics arrangement 300 of the invention. As an alternative, in the case of the molecular electronics arrangement 300, too, which is configured as molecular memory, protective layers may be provided on the unused uncovered surfaces of the first interconnects 302 and of the second interconnects 304.

Exemplary embodiments of the method according to the invention for fabricating a molecular electronics arrangement are described below.

A first preferred exemplary embodiment of the method according to the invention for fabricating a molecular electronics arrangement is described below with reference to FIG. 4A, FIG. 4B, FIG. 4C, FIG. 4D, FIG. 4E.

In accordance with the first preferred exemplary embodiment of the method for fabricating a molecular electronics arrangement, in a first step, at least one first interconnect 402, which has a surface 402a, is introduced into the surface of a substrate 401.

The layer arrangement 400 shown in FIG. 4A is obtained as a result. In accordance with the exemplary embodiment described, the at least one interconnect 402 is fabricated from gold material. The introduction of the at least one interconnect 402 into the substrate 401 is effected using the damascene technique. As described above, in accordance with the damascene technique, firstly a trench is etched into the surface of a substrate 401. Afterward, a metal layer is deposited onto the surface of the layer structure obtained. By means of CMP ("Chemical Mechanical Polishing"), the applied metal layer is polished away from the surface to an extent such that metal material remains only in the trench and a layer structure with a planar surface 402a is obtained. In accordance with the exemplary embodiment described, a preprocessed silicon wafer is used as the substrate 401.

In a second method step of the exemplary embodiment of the method for fabricating a molecular electronics arrangement, a spacer layer 403 is applied to the surface 402a of the at least one first interconnect 402, which spacer layer at least partly covers the surface 402a of the at least one first interconnect 402.

In accordance with the exemplary embodiment described, the spacer layer 403 is applied to the layer structure 400 using the ALD method (Atomic Layer Deposition) in order to obtain the layer arrangement 404 shown in FIG. 4B. Silicon dioxide is used as material for the spacer layer 403. As described above, the ALD method is a modified CVD method ("Chemical Vapor Deposition") in which the layer thickness can be set to an accuracy of one atomic layer (i.e. down to the range of a few angstroms) by alternately introducing two reaction gases into a process space, a monoatomic layer in each case being deposited on the surface. Through a suitable choice of the number of method steps, the thickness of the spacer layer 403 can therefore be set very accurately as a consequence of using the ALD method.

In a next method step, at least one second interconnect 405, which has a surface 405a areally opposite the surface 402a of the at least one first interconnect 402, is applied to the spacer layer 403, a distance between the at least one first interconnect 402 and the at least one second interconnect 405 being prescribed by means of the spacer layer 403.

The layer structure 406 shown in FIG. 4C is obtained as a result. The method step described has a plurality of substeps. In a first substep, a gold layer is applied to the surface of the layer arrangement 404. In a second step, using a suitable lithography and etching method, the applied gold layer is patterned in such a way that the at least one second interconnect 405 remains on the surface of the layer structure 406. In accordance with the exemplary embodiment described, two second interconnects 405 are fabricated in accordance with the method.

In a next method step, two spacers 403a are formed by the spacer layer 403 being partly etched back in such a way that an uncovered region of the surface of the at least one first interconnect 402 and an uncovered region of the surface of the at least one second interconnect 405 remain.

In other words, in this method step, the spacer layer 403 is etched back in such a way that spacers 403a remain. In accordance with the described exemplary embodiment of the method for fabricating a molecular electronics arrangement, this is done by means of wet-chemical etching back of the spacer layer 403 fabricated from silicon dioxide. The layer arrangement 407 resulting from this method step is shown in FIG. 4D. As shown in FIG. 4D the spacers 403a are undercut, so that the remaining regions of the spacers 403a are sufficiently narrow in the horizontal direction in accordance with FIG. 4D that uncovered surfaces 402a, 405a of the first and second interconnects 402, 405, respectively, remain in at least one crossover region between one of the first interconnects 402 and one of the second interconnects 405. In other words, the first and second interconnects 402, 405 projecting on both sides laterally beyond the spacers 403a form grooves 408 in which the two interconnect planes are opposite one another in plane-parallel fashion and into which molecular electronic molecules of a suitable thickness can be introduced.

In a further method step, molecular electronic molecules 409 are arranged between the uncovered region of the surface of the at least one first interconnect 402 and the uncovered region of the surface of the at least one second interconnect 405, the length of which molecules is equal to the distance between the at least one first interconnect 402 and the at least one second interconnect 405.

The layer arrangement 410 shown in FIG. 4E is obtained as a result. By virtue of the surfaces 402a, 405a of the first and second interconnects 402, 405 being partly uncovered and being provided at a distance from one another which corresponds to the length of the molecular electronic molecules 409 to be introduced, and by virtue of gold material being chosen as material for the first and second interconnects 402, 405, to which gold material molecular electronic molecules 409 can bind well via thiol groups, precautions are taken in order to realize the binding of molecular electronic molecules 409 to the interconnects 402, 405. If the molecular electronic molecules 409 are now passed to the layer arrangement 407, for example in dissolved form, then the molecular electronic molecules 409 are automatically coupled on both sides to one of the first interconnects 402 and one of the second interconnects 405. Since the coupling proceeds automatically without external action, the term self-assembly technique is also used.

The layer arrangement 410 shown in FIG. 4E largely corresponds to the molecular electronics arrangement 200 shown in FIG. 2A.

In a further method step, at least one of the first interconnects 402 and/or at least one of the second interconnects 405 may be coupled to at least one electrically conductive coupling element, so that the interconnects 402, 405 can be coupled to an external circuit. Furthermore, in a further method step, a portion of the first and/or of the second interconnects 402, 405 may be coupled to an external circuit by means of the electrically conductive coupling element. In order to form the electrically conductive coupling elements, contact holes may be introduced into the substrate 401 and the contact holes may be filled with an electrically conductive material.

The method steps by which the contact holes are introduced into the substrate 401 and by which the contact holes are filled with an electrically conductive material cannot be seen from FIG. 4A, FIG. 4B, FIG. 4C, FIG. 4D, FIG. 4E. Moreover, the external circuit, which is preferably integrated into the substrate 401, is not shown in FIG. 4A, FIG. 4B, FIG. 4C, FIG. 4D, FIG. 4E. Preferably, the associated method steps are carried out before the at least one first interconnect 402, which has a surface 402a, is introduced into the substrate 401. In other words, the electrically conductive coupling element and the external circuit, in accordance with FIG. 4A, are arranged at the layer arrangement from below.

A second preferred exemplary embodiment of the method according to the invention for fabricating a molecular electronics arrangement is described below with reference to FIG. 4A, FIG. 4B, FIG. 4C, FIG. 4D, FIG. 5A, FIG. 5B, FIG. 5C, FIG. 5D, FIG. 5E.

The first four method steps in accordance with the second preferred exemplary embodiment of the method according to the invention for fabricating a molecular electronics arrangement are identical to the first four method sections described above with reference to the first preferred exemplary embodiment of the method according to the invention for fabricating a molecular electronics arrangement. The layer arrangement 407 shown in FIG. 4D is obtained after carrying out these method steps. Said layer arrangement is used as a starting point for the description of the further method sequence.

In a departure from the above-described first preferred exemplary embodiment of the method for fabricating a molecular electronics, the method step which leads from the layer arrangement 407 shown in FIG. 4D to the layer arrangement 410 shown in FIG. 4E is not carried out below. Instead, before the introduction of the molecular electronic molecules into the layer arrangement 407, at least one protective layer 503 is applied to at least one portion of the uncovered regions of the surfaces of the first and/or of the second interconnects 402, 405.

Figure 5A:
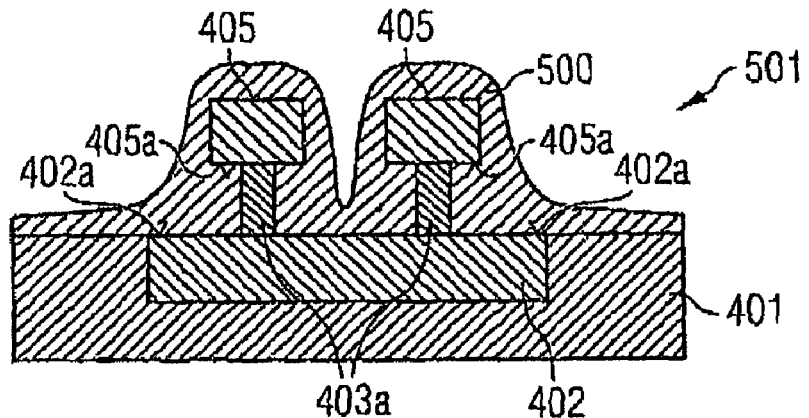
FIG. 5A shows a cross-sectional view of a layer arrangement after a fifth method section in accordance with another preferred exemplary embodiment of the method according to the invention for fabricating a molecular electronics arrangement.
Figure 5B:
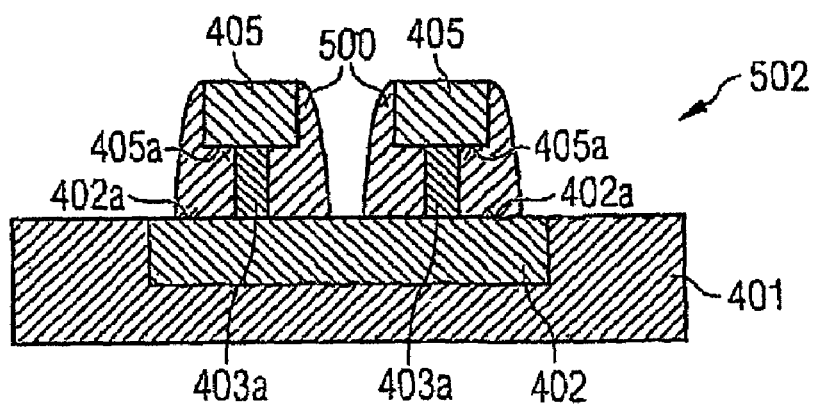
FIG. 5B shows a cross-sectional view of a layer arrangement after a sixth method section in accordance with the other preferred exemplary embodiment of the method according to the invention for fabricating a molecular electronics arrangement.
Figure 5C:
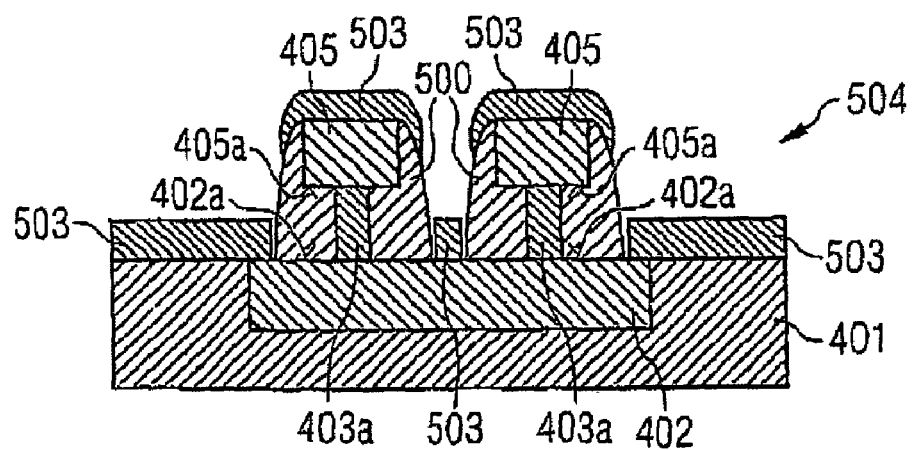
FIG. 5C shows a cross-sectional view of a layer arrangement after a seventh method section in accordance with the other preferred exemplary embodiment of the method according to the invention for fabricating a molecular electronics arrangement.
Figure 5D:
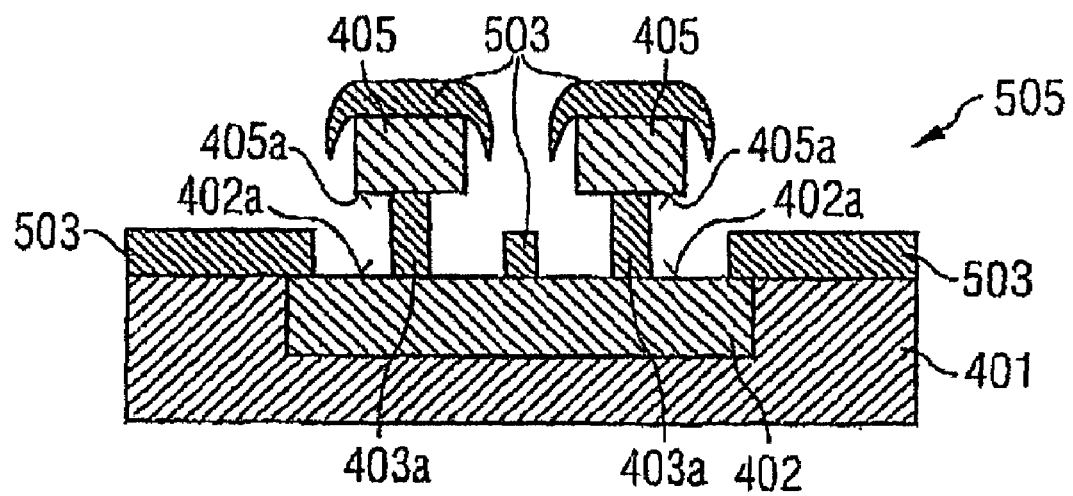
FIG. 5D shows a cross-sectional view of a layer arrangement after an eighth method section in accordance with the other preferred exemplary embodiment of the method according to the invention for fabricating a molecular electronics arrangement.

After carrying out this method step, the layer arrangement 505 shown in FIG. 5D is obtained, which has a plurality of substeps. In a first substep, an auxiliary layer 500 is applied to the layer arrangement 407, thereby obtaining the layer arrangement 501 shown in FIG. 5A. In accordance with the described exemplary embodiment of the method for fabricating a molecular electronics arrangement, the deposition of the auxiliary layer 500 is realized by means of a CVD deposition of a silicon nitride layer.

In a subsequent substep, the applied auxiliary layer 500 is etched back anisotropically. The layer arrangement 502 shown in FIG. 5B is thereby obtained. Anisotropic etching back means that the material of the auxiliary layer 500 is removed from the surface of the layer arrangement 501 in a predeterminable thickness by means of a directed etching method. As shown in FIG. 5B, after carrying out the anisotropic etching, the material of the auxiliary layer 500 remains exclusively in regions near the sidewalls of the spacers 403a and the second interconnects 405. Partial sections of the surface of the layer structure 502 are uncovered as a result. In particular, partial regions of the surface of the first interconnect 402 and partial regions of the second interconnect 405 are uncovered.

In a next substep, a protective layer 503 is applied to the surface of the layer arrangement 502. The application of the auxiliary layer 503, which is fabricated from silicon dioxide material in accordance with the second preferred exemplary embodiment of the method according to the invention for fabricating a molecular electronics arrangement, is effected in "directed" fashion. This means that the silicon dioxide layer is applied to the layer arrangement 502 without the sidewalls being covered. The layer arrangement 504 shown in FIG. 5C is thereby obtained. In particular, as shown in FIG. 5C, surface regions of the auxiliary layer 500 remain uncovered.

In a next substep, the material of the auxiliary layer 500 is etched away by wet-chemical etching using hot phosphoric acid ($H_3PO_4$). Hot phosphoric acid has the property of etching silicon nitride material, whereas silicon dioxide material is not etched by hot phosphoric acid. Therefore, only the auxiliary layer 500 is etched away during the wet-chemical etching method, whereas the protective layer 503 is not etched. This results in the layer arrangement SOS shown in FIG. 5D.

The layer arrangement 505 shown in FIG. 5D essentially corresponds to the preferred exemplary embodiment of the molecular electronics arrangement 210 as shown in FIG. 2B. In particular, regions covered with the protective layer 503 made of silicon dioxide material remain on parts of the uncovered surfaces of the first interconnect 402 and on parts of the uncovered surfaces of the second interconnect 405. This avoids a parasitic binding of molecular electronic molecules to such surface regions of the first and second interconnects 402, 405, at which, for geometrical reasons, molecular electronic molecules cannot simultaneously couple to one of the first interconnects 402 and to one of the second interconnects 405.

Figure 5E:
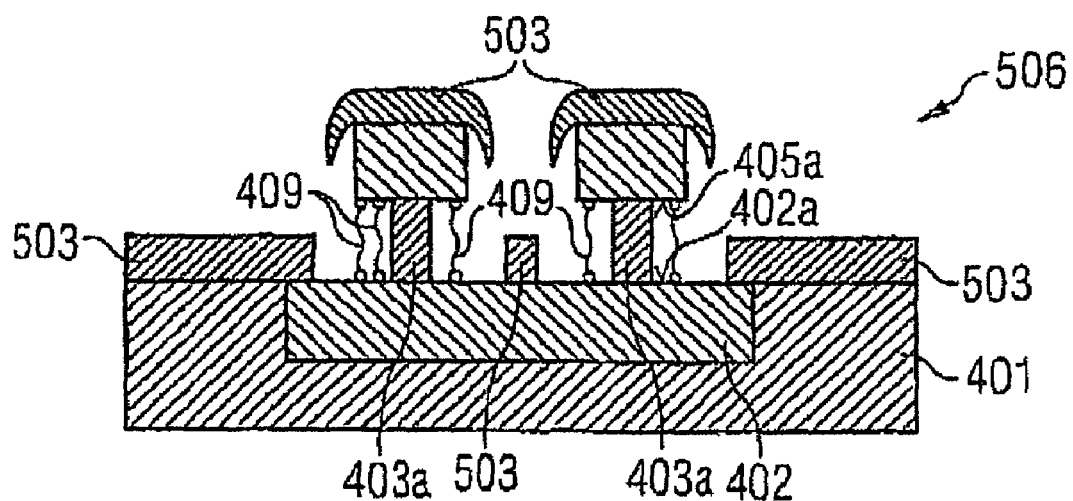
FIG. 5E shows a cross-sectional view of a layer arrangement after a ninth method section in accordance with the other preferred exemplary embodiment of the method according to the invention for fabricating a molecular electronics arrangement.

In a subsequent method step, molecular electronic molecules 409 are arranged between the uncovered region of the surface of the at least one first interconnect 402 and the uncovered region of the surface of the at least one second interconnect 405, the length of which molecules is equal to the distance between the at least one first interconnect 402 and the at least one second interconnect 405. The resulting layer arrangement 506 with the introduced molecular electronic molecules 409 in accordance with the second preferred exemplary embodiment of the method for fabricating a molecular electronics arrangement is shown in FIG. 5E.

A third preferred exemplary embodiment of the method according to the invention for fabricating a molecular electronics arrangement is described below with reference to FIG. 4A, FIG. 4B, FIG. 6A, FIG. 6B, FIG. 6C, FIG. 6D.

The first two method steps in accordance with the third preferred exemplary embodiment of the method according to the invention for fabricating a molecular electronics arrangement are identical to the first two method sections described above with reference to the first preferred exemplary embodiment of the method according to the invention for fabricating a molecular electronics arrangement. After carrying out these method steps, the layer arrangement 404 shown in FIG. 4B is obtained. Said layer arrangement is used as a starting point for the description of the further method sequence.

In a next method step, a continuous conductor layer and also a further protective layer 601 are applied to the surface of the layer arrangement 404.

In accordance with the described third preferred exemplary embodiment of the method according to the invention for fabricating a molecular electronics arrangement, the conductor layer made of gold material is deposited on the surface of the layer arrangement 404, and a further protective layer 601 fabricated from silicon nitride material is subsequently deposited on the surface of the continuous conductor layer.

In a subsequent method step, the continuous conductor layer and the further protective layer 601 are patterned in such a way that an at least one second interconnect 602 covered at least partly with the further protective layer 601 is thereby formed.

Figure 6A:
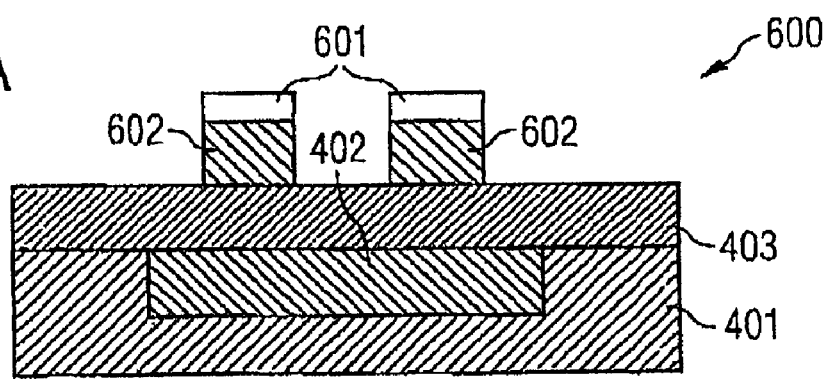
FIG. 6A shows a cross-sectional view of a layer arrangement after a third method section in accordance with a further preferred exemplary embodiment of the method according to the invention for fabricating a molecular electronics arrangement.
Figure 6B:
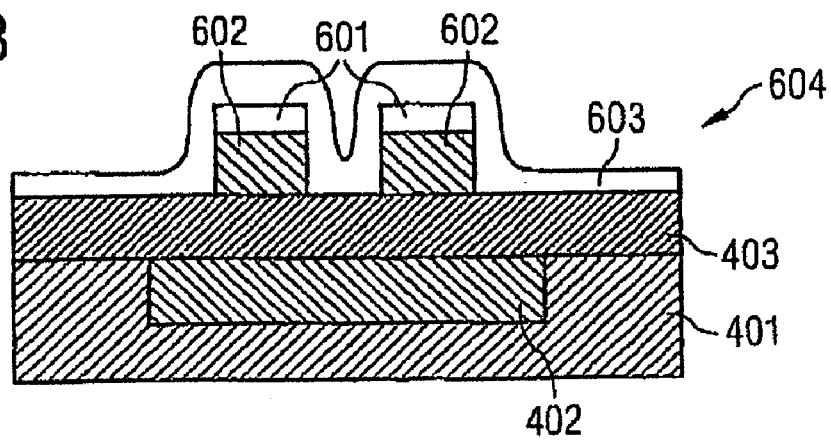
FIG. 6B shows a cross-sectional view of a layer arrangement after a fourth method section in accordance with the further preferred exemplary embodiment of the method according to the invention for fabricating a molecular electronics arrangement.

In other words, the conductor layer fabricated from gold material and the further protective layer 601 arranged thereabove are patterned jointly. This can be done for example by means of a suitable photolithography and etching method. After carrying out this method step, the layer arrangement 600 shown in FIG. 6A is obtained.

In a subsequent method step, before molecular electronic molecules are actually introduced into the arrangement, a protective layer 603 is applied to at least one portion of the uncovered regions of the surfaces of the first and/or of the second interconnects 402, 602. The method step described has a plurality of substeps.

In a first substep, a protective layer 603 is applied on the entire surface of the layer arrangement 600. This is realized according to the invention by a silicon nitride layer being deposited on the surface of the layer arrangement 600 using the CVD method, thereby obtaining the layer arrangement 604 shown in FIG. 6B.

Figure 6C:
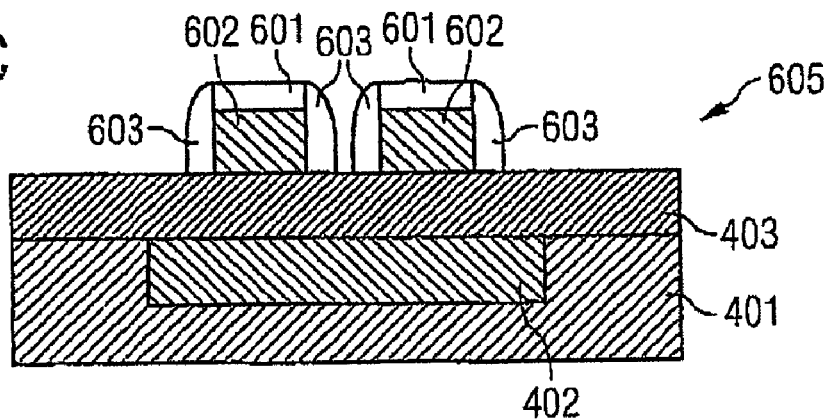
FIG. 6C shows a cross-sectional view of a layer arrangement after a fifth method section in accordance with the further preferred exemplary embodiment of the method according to the invention for fabricating a molecular electronics arrangement.

In a further substep, the protective layer 603 is etched back anisotropically, thereby obtaining the layer arrangement 605 shown in FIG. 6C. In other words, material of the protective layer 603 with a predeterminable thickness is etched away from the entire surface of the layer arrangement 604, so that, as shown in FIG. 6C, regions of the spacer layer 403 are uncovered on the surface of the layer arrangement 605.

In a further method step, spacers 403a are formed by means of partial etching-back of the spacer layer 403, in such a way that an uncovered region of the surface of the at least one first interconnect 402 and an uncovered region of the surface of the at least one second interconnect 602 remain.

Figure 6D:
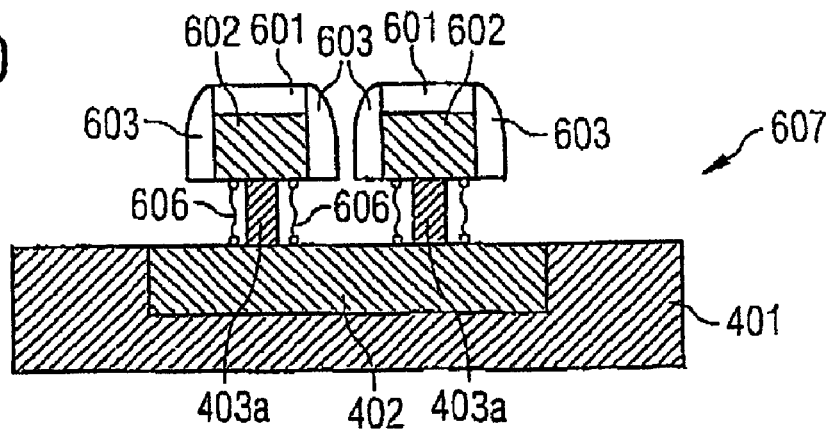
FIG. 6D shows a cross-sectional view of a layer arrangement after a sixth method section in accordance with the further preferred exemplary embodiment of the method according to the invention for fabricating a molecular electronics arrangement.

This method step is realized by the spacer layer 403 fabricated from silicon dioxide material being etched back wet-chemically and being undercut. Spacers 403a are thereby formed, so that, as shown in FIG. 6D, the first interconnects 402 and the second interconnects 602 project laterally on both sides beyond the spacers 403a. Clearly, in accordance with the third exemplary embodiment of the method according to the invention for fabricating a molecular electronics arrangement, as shown in FIG. 6D, the second interconnects 602 are partly covered with a U-shaped protective layer, which protective layer is formed by the protective layer 603 and the further protective layer 601. Therefore, that surface region of the second interconnect 602 which is covered with the protective layer 601, 603 is protected from a parasitic binding of molecular electronic molecules.

In a next method step, molecular electronic molecules 606 are arranged between the uncovered region of the surface of the at least one first interconnect 402 and the uncovered region of the surface of the at least one second interconnect 602, the length of which molecules is equal to the distance between the at least one first interconnect 402 and the at least one second interconnect 602.

After the introduction of the molecules, which are bispyridinium molecules in accordance with the described exemplary embodiment of the method according to the invention for fabricating a molecular electronics arrangement, the layer arrangement 607 shown in FIG. 6D is obtained. The layer arrangement 607 shown in FIG. 6D essentially corresponds to the molecular electronics arrangement 220 shown in FIG. 2C.

The invention claimed is:

1. A molecular electronics arrangement comprising:
a substrate;
at least one first interconnect, which has a surface and which is arranged in or on the substrate;
a spacer arranged on the surface of the at least one first interconnect, the spacer partly covers the surface of the at least one first interconnect;
at least one second interconnect arranged on the spacer, the second interconnect has a surface areally opposite to the surface of the at least one first interconnect, the spacer partly covering the surface of the at least one second interconnect, and a predetermined distance between the at least one first interconnect and the at least one second interconnect being defined by means of the spacer; and
molecular electronic molecules arranged between an uncovered region of the surface of the at least one first interconnect and an uncovered region of the surface of the at least one second interconnect such that one part of each molecular electronic molecule is coupled to the at least one first interconnect and another part of each molecular electronic molecule is coupled to the at least one second interconnect, the molecular electronic molecule having a length that is essentially equal to the distance between the at least one first interconnect and the at least one second interconnect.

2. The molecular electronics arrangement as claimed in claim 1, in which at least one of the first interconnects and/or at least one of the second interconnects are/is coupled to at least one electrically conductive coupling element, by means of which the interconnects can be coupled to an external circuit.

3. The molecular electronics arrangement as claimed in claim 2, in which the at least one electrically conductive coupling element is a contact hole filled with an electrically conductive material, which contact hole is introduced into the substrate.

4. The molecular electronics arrangement as claimed in claim 2, which furthermore has an external circuit, which is coupled to at least one of the first interconnects and/or of the second interconnects by means of the electrically conductive coupling elements.

5. The molecular electronics arrangement as claimed in claim 4, in which the external circuit is an integrated circuit introduced into the substrate.

6. The molecular electronics arrangement as claimed in claim 4, in which the external circuit is fabricated using CMOS technology.

7. The molecular electronics arrangement as claimed in claim 2, in which the electrically conductive coupling elements are fabricated from polysilicon material, aluminum material or tungsten material.

8. The molecular electronics arrangement as claimed in claim 1, which furthermore has at least one protective layer on at least one portion of the uncovered surfaces of the first and/or of the second interconnects.

9. The molecular electronics arrangement as claimed in claim 8, in which the at least one protective layer is fabricated from one or a combination of the materials silicon dioxide and silicon nitride.

10. The molecular electronics arrangement as claimed in claim 1, in which the substrate is a silicon wafer.

11. The molecular electronics arrangement as claimed in claim 1, in which the interconnects are fabricated from one or a combination of the materials gold, platinum, silver, silicon, aluminum and titanium.

12. The molecular electronics arrangement as claimed in claim 1, in which the spacer is fabricated from one or a combination of the materials silicon dioxide and silicon nitride.

13. The molecular electronics arrangement as claimed in claim 1, in which at least a portion of the molecular electronic molecules are redox-active bispyridinium molecules and/or alkyltrichlorosilane molecules.

14. The molecular electronics arrangement as claimed in claim 1, in which a two-sided coupling of the molecular electronic molecules to the interconnects is a thiol-gold coupling and/or a coupling of a trichlorosilane group to one of the materials silicon, aluminum and titanium.

15. A method for fabricating a molecular electronics arrangement, comprising:
providing a substrate;
introducing or applying at least one first interconnect, which has a surface, into or to the surface of the substrate;
applying a spacer layer to the surface of the at least one first interconnect at least partly covering the surface of the at least one first interconnect;
applying at least one second interconnect to the spacer layer, the at least one second interconnect has a surface areally opposite the surface of the at least one first interconnect, a predetermined distance between the at least one first interconnect and the at least one second interconnect being prescribed by means of the spacer layer;
forming at least one spacer by partly removing the spacer layer in such a way that an uncovered region of the surface of the at least one first interconnect and an uncovered region of the surface of the at least one second interconnect is formed; and
arranging molecular electronic molecules between the uncovered region of the surface of the at least one first interconnect and the uncovered region of the surface of the at least one second interconnect such that one part or each molecular electronic molecule is coupled to the at least one first interconnect and another part of each molecular electronic molecule is coupled to the at least one second interconnect, the molecular electronic molecule having a length that is essentially equal to the distance between the at least one first interconnect and the at least one second interconnect.

16. The method as claimed in claim 15, further comprising:
coupling at least one of the first interconnects and/or at least one of the second interconnects to at least one electrically conductive coupling element, so that the interconnects can be coupled to an external circuit.

17. The method as claimed in claim 16, further comprising:
  forming the electrically conductive coupling elements by introducing contact holes into the substrate and filling the contact holes with an electrically conductive material.

18. The method as claimed in claim 16, further comprising:
  coupling at least one portion of the first and/or of the second interconnects to an external circuit by means of the electrically conductive coupling elements.

19. The method as claimed in claim 18, in which the external circuit is integrated into the substrate.

20. The method as claimed in claim 16, in which the electrically conductive coupling elements are fabricated from polysilicon material, aluminum material or tungsten material.

21. The method as claimed in claim 15, further comprising:
  applying, before the molecular electronic molecules are introduced into the arrangement, at least one protective layer to at least one portion of the uncovered regions of the surfaces of the first and/or of the second interconnects.

22. The method as claimed in claim 15, further comprising, instead of applying the at least one second interconnect to the spacer layer:
  applying a continuous conductor layer and also a further protective layer to the surface of the arrangement; and
  patterning the continuous conductor layer and the further protective layer in such a way that at least one second interconnect at least partly covered with the further protective layer is thereby formed.

23. The method as claimed in claim 22, in which independently of one another, the spacer, the protective layer and/or the further protective layer are fabricated from one or a combination of the materials silicon dioxide and silicon nitride.

24. The method as claimed in claim 15, wherein:
  during the introduction of the molecular electronic molecules into the arrangement, electrical voltages are applied at least to a portion of the interconnects, in such a way that the molecular electronic molecules are coupled with a preferred geometrical orientation to one of the at least one first interconnects and to one of the at least one second interconnects.

25. The method as claimed in claim 15, wherein the at least one first interconnect is introduced into the surface of the substrate using damascene technology.

26. The method as claimed in claim 15, in which the spacer layer is applied to the surface of the layer arrangement by means of atomic layer deposition.

27. The method as claimed in claim 15, in which the external circuit is integrated into the substrate by means of CMOS technology.

28. The method as claimed in claim 15, in which a silicon wafer is used as the substrate.

29. The method as claimed in claim 15, in which the interconnects are fabricated from one or a combination of the materials gold, platinum, silver, silicon, aluminum and titanium.

30. The method as claimed in claim 15, in which redox-active bispyridinium molecules and/or alkyltrichlorosilane molecules are used as molecular electronic molecules.

* * * * *

UNITED STATES PATENT AND TRADEMARK OFFICE
CERTIFICATE OF CORRECTION

| | |
|---|---|
| PATENT NO. | : 7,189,988 B2 |
| APPLICATION NO. | : 10/482719 |
| DATED | : March 13, 2007 |
| INVENTOR(S) | : Jessica Hartwich et al. |

Page 1 of 1

It is certified that error appears in the above-identified patent and that said Letters Patent is hereby corrected as shown below:

Column 6, line 32, delete "there" and insert in place thereof --they--.

Column 7, line 27, insert new paragraph indent.

Column 13, line 43, delete "1A 1B" and insert in place thereof --1A-1B--.

Column 15, line 11, insert new paragraph indent.

Column 17, line 43, insert new paragraph indent.

Column 26, line 55, delete "or" and insert in place thereof --of--.

Signed and Sealed this

Ninth Day of September, 2008

JON W. DUDAS
*Director of the United States Patent and Trademark Office*